(12) United States Patent
Kosugi et al.

(10) Patent No.: US 11,733,304 B2
(45) Date of Patent: Aug. 22, 2023

(54) DETERMINATION APPARATUS

(71) Applicant: NEC CORPORATION, Tokyo (JP)

(72) Inventors: Shinichiro Kosugi, Tokyo (JP); Hiroshi Hanafusa, Tokyo (JP); Yusuke Mori, Tokyo (JP)

(73) Assignee: NEC CORPORATION, Tokyo (JP)

( * ) Notice: Subject to any disclaimer, the term of this patent is extended or adjusted under 35 U.S.C. 154(b) by 144 days.

(21) Appl. No.: 16/973,218

(22) PCT Filed: Jun. 27, 2018

(86) PCT No.: PCT/JP2018/024355
§ 371 (c)(1),
(2) Date: Dec. 8, 2020

(87) PCT Pub. No.: WO2020/003402
PCT Pub. Date: Jan. 2, 2020

(65) Prior Publication Data
US 2021/0325465 A1    Oct. 21, 2021

(51) Int. Cl.
*G01R 31/367* (2019.01)
*G01R 31/36* (2020.01)

(52) U.S. Cl.
CPC ............ *G01R 31/367* (2019.01); *G01R 31/36* (2013.01)

(58) Field of Classification Search
CPC .............................. G01R 31/367; G01R 31/36
See application file for complete search history.

(56) References Cited

U.S. PATENT DOCUMENTS

| | | | |
|---|---|---|---|
| 2011/0161025 A1* | 6/2011 | Tomura | H01M 10/48 702/63 |
| 2015/0046109 A1* | 2/2015 | Miwa | G01R 31/392 702/63 |

(Continued)

FOREIGN PATENT DOCUMENTS

| | | | | |
|---|---|---|---|---|
| JP | 2000-012098 A | 1/2000 | | |
| JP | 2000012098 A | * | 1/2000 | ......... G01R 31/3679 |

(Continued)

OTHER PUBLICATIONS

Bloom et al., "An accelerated calendar and cycle life study of Li-ion cells" Journal of Power Sources 101 (2001) 238-247 (Year: 2001).*

(Continued)

*Primary Examiner* — John C Kuan
(74) *Attorney, Agent, or Firm* — Sughrue Mion, PLLC

(57) ABSTRACT

A determination apparatus (10) includes: a criteria value acquisition unit (11) that acquires a criteria value which is a performance value of a storage battery at a criteria time; a target value acquisition unit (12) that acquires a target value which is the performance value of the storage battery at a determination time; a usage method data acquisition unit (13) that acquires usage method data indicating a usage method of the storage battery from the criteria time to the determination time; a predicted range computing unit (14) that computes a predicted range of the performance value at the determination time on the basis of the criteria value, the usage method data, and a time elapsed from the criteria time to the determination time; and a determination unit (15) that determines that the storage battery is not to be compensated if the target value is within the predicted.

8 Claims, 13 Drawing Sheets

(56) References Cited

U.S. PATENT DOCUMENTS

| | | | |
|---|---|---|---|
| 2015/0338471 A1 | 11/2015 | Ichikawa et al. | |
| 2017/0031404 A1 | 2/2017 | Yamamoto et al. | |
| 2018/0095137 A1 | 4/2018 | Yoshioka et al. | |
| 2018/0143256 A1 | 5/2018 | Horie et al. | |
| 2018/0358663 A1* | 12/2018 | Yonemoto | B60K 6/445 |

FOREIGN PATENT DOCUMENTS

| | | |
|---|---|---|
| JP | 2014-072932 A | 4/2014 |
| JP | 2015-222195 A | 12/2015 |
| JP | 2017-133870 A | 8/2017 |
| JP | 2018-019552 A | 2/2018 |
| JP | 2018-057220 A | 4/2018 |
| WO | 2016/162900 A1 | 10/2016 |
| WO | 2017/022037 A1 | 2/2017 |
| WO | 2017/043248 A1 | 3/2017 |
| WO | WO-2017098686 A1 * | 6/2017 |

OTHER PUBLICATIONS

Wang et al., "Cycle-life model for graphite-LiFePO4 cells" Journal of Power Sources 196 (2011) 3942-3948 (Year: 2011).*

International Search Report for PCT/JP2018/024355 dated Oct. 2, 2018 [PCT/ISA/210].

Written Opinion for PCT/JP2018/024355 dated Oct. 2, 2018 [PCT/ISA/237].

* cited by examiner

DETERMINATION APPARATUS

CROSS REFERENCE TO RELATED APPLICATIONS

This application is a National Stage of International Application No. PCT/JP2018/024355 filed Jun. 27, 2018.

TECHNICAL FIELD

The present invention relates to a determination apparatus, a determination method, and a program.

BACKGROUND ART

Patent Document 1 discloses an invention that appropriately detects abnormal deterioration of a lithium ion secondary battery. An apparatus for detecting abnormal deterioration of a lithium ion secondary battery of the invention includes a peak shift amount computing unit, a capacity maintenance rate computing unit, and an abnormal deterioration determination unit. The peak shift amount computing unit sets as the peak voltage, the value of the battery voltage V at which the value of dQ/dV is the maximum value, and computes the peak shift amount on the basis of the amount of change from the initial peak voltage. The abnormal deterioration determination unit determines that abnormal deterioration has occurred when an increase amount in the peak shift amount computed by the peak shift amount computing unit in the predetermined period with respect to a decrease amount in the capacity maintenance rate computed by the peak shift amount computing unit in the predetermined period is greater than the increase amount in the peak shift amount in the predetermined period with respect to the decrease amount in the capacity maintenance rate determined for normal deterioration of the lithium ion secondary battery in the predetermined period.

RELATED DOCUMENT

Patent Document

[Patent Document 1] Japanese Unexamined Patent Application Publication No. 2017-133870

SUMMARY OF THE INVENTION

Technical Problem

In recent years, storage batteries have become popular. Further spread is expected by enhancing the service to compensate for defects in storage batteries. However, if all types of defects are to be compensated, the burden on the service provider will increase. This problem can be solved by defining a range of defects to be compensated in advance and compensating only for defects within the range. However, when the range of defects to be compensated is significantly narrow, the merit of receiving the service becomes small.

Patent Document 1 is an invention for detecting abnormal deterioration of a battery, and neither describes nor suggests means for solving the problem relating to a service for compensating for a defect in a storage battery. Further, although the invention of Patent Document 1 distinguishes between abnormal deterioration and normal deterioration, the accuracy of the distinguishing is not sufficient because the method of using the battery is not taken into consideration.

An object of the present invention is to enhance services for compensating for defects in storage batteries.

Solution to Problem

According to the present invention, provided is a determination apparatus including:
a criteria value acquisition unit which acquires a criteria value that is a first performance value of a storage battery at a criteria time;
a target value acquisition unit which acquires a target value that is the first performance value of the storage battery at a determination time;
a usage method data acquisition unit which acquires usage method data indicating a usage method of the storage battery from the criteria time to the determination time;
a predicted range computing unit which computes a predicted range of the first performance value at the determination time on the basis of the criteria value, the usage method data, and a time elapsed from the criteria time to the determination time; and
a determination unit which determines that the storage battery is not to be compensated if the target value is within the predicted range and that the storage battery is to be compensated if the target value is outside the predicted range.

Further, according to the present invention, provided is a determination apparatus including:
a target value acquisition unit which acquires a target value that is a first performance value of a storage battery to be determined at a determination time;
a reference value acquisition unit which acquires, as reference values, the first performance values at the determination time of a plurality of reference storage batteries used in the same usage method as the storage battery to be determined, from a criteria time to the determination time;
a computing unit which computes a degree of variation of a plurality of values including a plurality of the reference values and the target value; and
a determination unit which determines whether or not the storage battery to be determined is to be compensated on the basis of the degree of variation and the target value.

Further, according to the present invention, provided is a determination apparatus including:
a target value acquisition unit which acquires a target value that is a first performance value of a storage battery to be determined at a determination time;
a reference value acquisition unit which acquires, as reference values, the first performance values at the determination time of a plurality of reference storage batteries used in the same usage method as the storage battery to be determined, from a criteria time to the determination time;
a computing unit which computes statistical values of a plurality of values including a plurality of the reference values and the target value; and
a determination unit which determines that the storage battery is not to be compensated if a difference between the statistic value and a criteria value is within a threshold, and that the storage battery is to be compensated if the difference is greater than the threshold.

Further, according to the present invention, provided is a determination method executed by a computer, the method including:

a criteria value acquisition step of acquiring a criteria value that is a first performance value of a storage battery at a criteria time;

a target value acquisition step of acquiring a target value that is the first performance value of the storage battery at a determination time;

a usage method data acquisition step of acquiring usage method data indicating a usage method of the storage battery from the criteria time to the determination time;

a predicted range computing step of computing a predicted range of the first performance value at the determination time on the basis of the criteria value, the usage method data, and a time elapsed from the criteria time to the determination time; and a determination step of determining that the storage battery is not to be compensated if the target value is within the predicted range and that the storage battery is to be compensated if the target value is outside the predicted range.

Further, according to the present invention, provided is a program causing a computer to function as:

a criteria value acquisition unit which acquires a criteria value that is a first performance value of a storage battery at a criteria time;

a target value acquisition unit which acquires a target value that is the first performance value of the storage battery at a determination time;

a usage method data acquisition unit which acquires usage method data indicating a usage method of the storage battery from the criteria time to the determination time;

a predicted range computing unit which computes a predicted range of the first performance value at the determination time on the basis of the criteria value, the usage method data, and a time elapsed from the criteria time to the determination time; and a determination unit which determines that the storage battery is not to be compensated if the target value is within the predicted range and that the storage battery is to be compensated if the target value is outside the predicted range.

Further, according to the present invention, provided is a determination method executed by a computer, the method including:

a target value acquisition step of acquiring a target value that is a first performance value of a storage battery to be determined at a determination time;

a reference value acquisition step of acquiring, as reference values, the first performance values at the determination time of a plurality of reference storage batteries used in the same usage method as the storage battery to be determined, from a criteria time to the determination time;

a computing step of computing a degree of variation of a plurality of values including a plurality of the reference values and the target value; and a determination step of determining whether or not the storage battery to be determined is to be compensated on the basis of the degree of variation and the target value.

Further, according to the present invention, provided is a program causing a computer to function as:

a target value acquisition unit which acquires a target value that is a first performance value of a storage battery to be determined at a determination time;

a reference value acquisition unit which acquires, as reference values, the first performance values at the determination time of a plurality of reference storage batteries used in the same usage method as the storage battery to be determined, from a criteria time to the determination time;

a computing unit which computes a degree of variation of a plurality of values including a plurality of the reference values and the target value; and a determination unit which determines whether or not the storage battery to be determined is to be compensated on the basis of the degree of variation and the target value.

Further, according to the present invention, provided is a determination method executed by a computer, the method including:

a target value acquisition step of acquiring a target value that is a first performance value of a storage battery to be determined at a determination time;

a reference value acquisition step of acquiring, as reference values, the first performance values at the determination time of a plurality of reference storage batteries used in the same usage method as the storage battery to be determined, from a criteria time to the determination time;

a computing step of computing statistical values of a plurality of values including a plurality of the reference values and the target value; and a determination step of determining that the storage battery is not to be compensated if a difference between the statistic value and a criteria value is within a threshold, and that the storage battery is to be compensated if the difference is greater than the threshold.

Further, according to the present invention, provided is a program causing a computer to function as:

a target value acquisition unit which acquires a target value that is a first performance value of a storage battery to be determined at a determination time;

a reference value acquisition unit which acquires, as reference values, the first performance values at the determination time of a plurality of reference storage batteries used in the same usage method as the storage battery to be determined, from a criteria time to the determination time;

a computing unit which computes statistical values of a plurality of values including a plurality of the reference values and the target value; and a determination unit which determines that the storage battery is not to be compensated if a difference between the statistic value and a criteria value is within a threshold, and that the storage battery is to be compensated if the difference is greater than the threshold.

Advantageous Effects of Invention

According to the present invention, it is possible to enhance services for compensating for defects in storage batteries.

BRIEF DESCRIPTION OF THE DRAWINGS

The above-described object and other objects, features and advantages will be further clarified by the preferred embodiments described below and the following drawings attached thereto.

DESCRIPTION OF EMBODIMENTS

First Example Embodiment

First, an outline of a determination apparatus of the present example embodiment will be described. The determination apparatus determines whether or not the defect that has occurred in the storage battery is to be compensated. In a service for compensating for a defect in a storage battery, deterioration of predetermined performance of the storage battery is compensated. However, natural deterioration is not to be compensated, and other types of abnormal deterioration are to be compensated. Natural deterioration is deterioration caused by the use of storage batteries. Abnormal deterioration is deterioration caused by a problem of the storage battery itself, such as a design defect.

The determination apparatus of the present example embodiment determines whether the deterioration in the predetermined performance occurring in the storage battery is to be compensated, by considering the state of a predetermined performance of the storage battery at the criteria time, the state of a predetermined performance of the storage battery at the determination time, the usage method of the storage battery from the criteria time to the determination time, and the elapsed time from the criteria time to the determination time.

By considering not only the state of a predetermined performance of the storage battery at the determination time, but also the state of the predetermined performance of the storage battery at the criteria time, the usage method of the storage battery from the criteria time to the determination time, and the elapsed time from the criteria time to the determination time, it is possible to accurately determine whether the deterioration of the predetermined performance occurring in the storage battery is natural deterioration or abnormal deterioration. As a result, it is possible to make a reasonable conclusion for both the service provider who provides the service for compensating the defect in the storage battery and the user of the storage battery who receives the service. The details will be described below.

Figure 1:
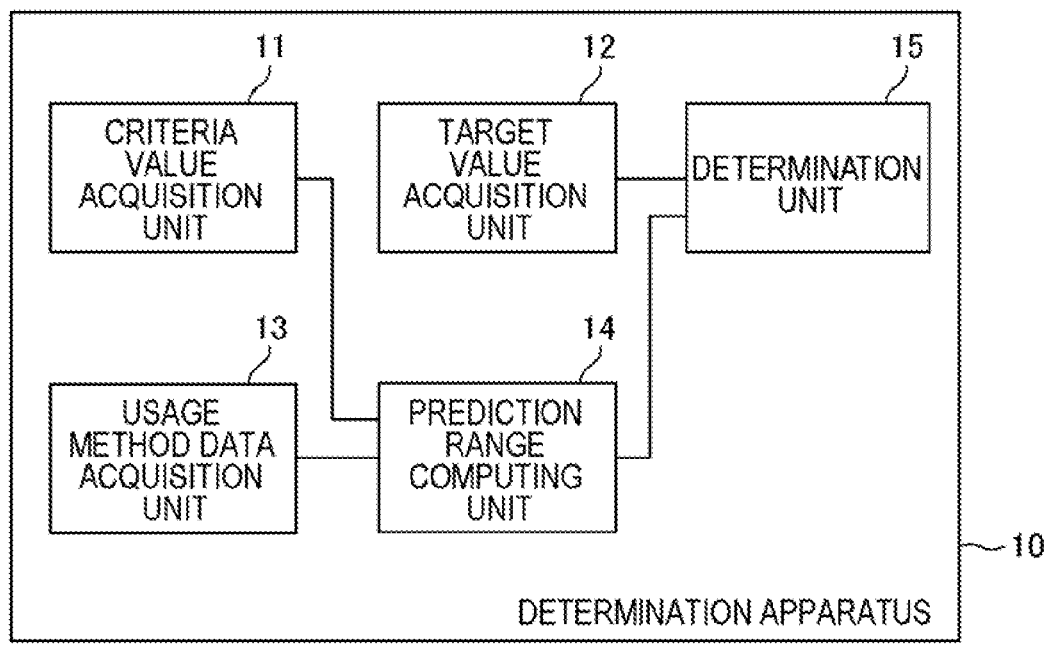
FIG. 1 is an example of a functional block diagram of a determination apparatus of the present example embodiment.

FIG. 1 illustrates an example of a functional block diagram of the determination apparatus 10 of the present example embodiment. The functional block diagram illustrates blocks in functional units, not in hardware units. The determination apparatus 10 may be composed of a plurality of physically and/or logically separated apparatuses, or may be composed of one apparatus physically and logically.

As illustrated, the determination apparatus 10 includes a criteria value acquisition unit 11, a target value acquisition unit 12, a usage method data acquisition unit 13, a prediction range computing unit 14, and a determination unit 15.

Each functional unit included in the determination apparatus 10 of the present example embodiment is configured with any combination of hardware and software, mainly using a storage unit such as a central processing unit (CPU) of any computer, a memory, a program to be loaded into the memory, and a hard disk storing the program (can store programs stored in advance in the stage of shipping the apparatus, and also store programs downloaded from a storage medium such as a compact disc (CD) or a server on the Internet), and a network connection interface. Those skilled in the art will understand that there are various modifications in the configuration methods and apparatuses.

Figure 2:
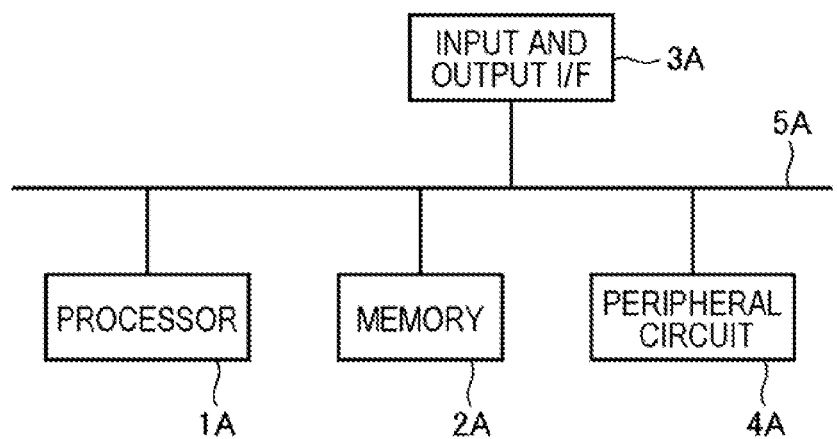
FIG. 2 is a diagram illustrating an example of a hardware configuration of the determination apparatus of the present example embodiment.

FIG. 2 is a block diagram illustrating a hardware configuration of the determination apparatus 10 of the present example embodiment. As illustrated in FIG. 2, the determination apparatus 10 includes a processor 1A, a memory 2A, an input and output interface 3A, a peripheral circuit 4A, and a bus 5A. The peripheral circuit 4A includes various modules. Note that, the apparatus may not have the peripheral circuit 4A.

The bus 5A is a data transmission path through which the processor 1A, the memory 2A, the peripheral circuit 4A, and the input and output interface 3A mutually transmit and receive data. The processor 1A is, for example, an arithmetic processing apparatus such as a central processing unit (CPU) or a graphics processing unit (GPU). The memory 2A is, for example, a memory such as a random access memory (RAM) or a read only memory (ROM). The input and output interface 3A includes an interface for acquiring information from an input apparatus, an external apparatus, an external server, an external sensor, and the like, and an interface for outputting information to an output apparatus, an external apparatus, an external server, and the like. The input apparatus is, for example, a keyboard, a mouse, a microphone, or the like. The output apparatus is, for example, a display, a speaker, a printer, a mailer, or the like. The processor 1A can issue a command to each module and perform a calculation on the basis of the calculation result.

Returning to FIG. 1, the criteria value acquisition unit 11 acquires a criteria value that is a first performance value of a storage battery at a criteria time. The "criteria time" is any time before the determination time when it is determined whether the deterioration of the first performance occurring in the storage battery is to be compensated. The criteria time may be a concept of pinpoint timing or a concept with a predetermined time width.

The "first performance" is performance that is compensated when abnormal deterioration occurs, and is exemplified by, for example, battery capacity [Wh], maximum input power [W], maximum output power [W], or the like. The "first performance value" is a value indicating the state of the first performance. When the first performance is the battery capacity, the first performance value is the battery capacity of the storage battery. When the first performance is the maximum input power, the first performance value is the maximum input power of the storage battery. When the first performance is the maximum output power, the first performance value is the maximum output power of the storage battery.

Here, "acquisition" in the present example embodiment will be described. The "acquisition" in the present example embodiment includes at least one of active acquisition and passive acquisition. The active acquisition can include, for example, the acquisition of data or information stored in another apparatus or a storage medium by the own apparatus (determination apparatus 10). The active acquisition includes, for example, transmitting a request or inquiry from the own apparatus to another apparatus and receiving the data or information returned in response to the request or inquiry, accessing the other apparatus or the storage medium and reading the data or information, or the like. Passive acquisition can include the acquisition of data or information that is output to own apparatus from other apparatuses. The passive acquisition includes, for example, receiving data or information that is distributed, transmitted, push-notified, or the like, receiving data or information input through an input apparatus included in the own apparatus or an input apparatus connected to the own apparatus, or the like. The acquisition may include selectively acquiring data or information from the received data or information, or selectively receiving data or information from the distributed data or information. Note that, the premise regarding acquisition applies to all the following example embodiments.

The target value acquisition unit 12 acquires a target value that is the first performance value of the storage battery at the time of determination. The "determination time" is a time when it is determined whether the deterioration of the first performance occurring in the storage battery is to be compensated. The determination time may be a concept of pinpoint timing or a concept with a predetermined time width.

The usage method data acquisition unit 13 acquires usage method data indicating the usage method of the storage battery from the criteria time to the determination time. The usage method data indicates a usage method that may affect the deterioration of the first performance of the storage battery.

The prediction range computing unit 14 computes the prediction range of the first performance value at the determination time on the basis of the criteria value acquired by the criteria value acquisition unit 11, the usage method data acquired by the usage method data acquisition unit 13, and the elapsed time from the criteria time to the determination time. This prediction range indicates a prediction range of the first performance value at the determination time of the storage battery when the first performance of the storage battery is naturally deteriorated by using the storage battery, whose first performance value at the criteria time is the criteria value, in the usage method indicated by the usage method data from the criteria time to the determination time.

When the target value acquired by the target value acquisition unit 12 is within the prediction range computed by the prediction range computing unit 14, the determination unit 15 determines that a defect occurring in the storage battery to be determined, that is, the first performance deterioration is not to be compensated. On the other hand, when the target value is out of the above prediction range, it is determined that a defect occurring in the storage battery to be determined, that is, the first performance deterioration is to be compensated. Then, the determination unit 15 can output the determination result. The output of the determination result is enabled through any output apparatus such as a display, a speaker, a printer, a projection apparatus, and a mailer.

Figure 3:
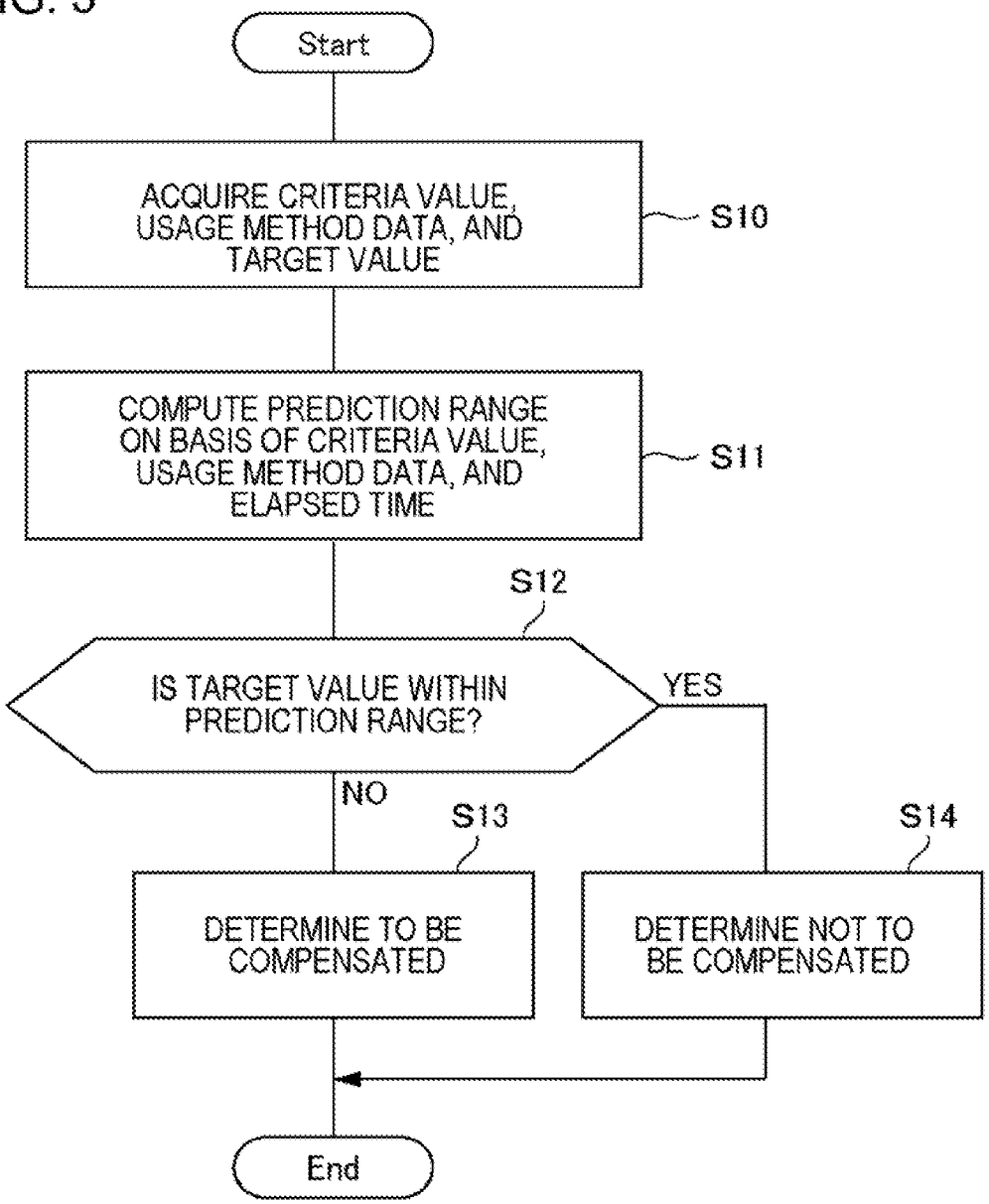
FIG. 3 is a flowchart illustrating an example of a processing flow of the determination apparatus according to the present example embodiment.

Next, an example of the processing flow of the determination apparatus 10 of the present example embodiment will be described with reference to the flowchart of FIG. 3.

In S10, the criteria value acquisition unit 11 acquires a criteria value that is a first performance value of a storage battery at a criteria time. Further, in S10, the target value acquisition unit 12 acquires a target value that is the first performance value of the storage battery at the determination time. Further, in S10, the usage method data acquisition unit 13 acquires usage method data indicating the usage method of the storage battery from the criteria time to the determination time.

In S11, the prediction range computing unit 14 computes the prediction range of the first performance value of the storage battery at the determination time on the basis of the criteria value, the usage method data, and the elapsed time from the criteria time to the determination time acquired in S10.

In S12, the determination unit 15 determines whether the target value acquired in S10 is within the prediction range computed in S11. When the target value is within the prediction range (Yes in S12), the determination unit 15 determines that the deterioration of the first performance occurring in the storage battery to be determined is not to be compensated (S14). On the other hand, when the target value is not within the prediction range (No in S12), the determination unit 15 determines that the deterioration of the first performance occurring in the storage battery to be determined is to be compensated (S13).

According to the determination apparatus 10 of the present example embodiment described above, by considering not only the state of a first performance of the storage battery at the determination time, but also the state of the first performance of the storage battery at the criteria time, the usage method of the storage battery from the criteria time to the determination time, and the elapsed time from the criteria time to the determination time, it is possible to accurately determine whether the deterioration of first performance occurring in the storage battery is natural deterioration or abnormal deterioration. As a result, it is possible to make a reasonable conclusion for both the service provider who provides the service for compensating the defect in the storage battery and the user of the storage battery who receives the service. That is, the service for compensating for the deterioration in the storage battery can be enhanced. As a result, further popularization of storage batteries is expected.

Second Example Embodiment

The determination apparatus 10 of the present example embodiment performs the same process as the determination apparatus 10 of the first example embodiment, but the processing contents is made more concrete.

Figure 4:
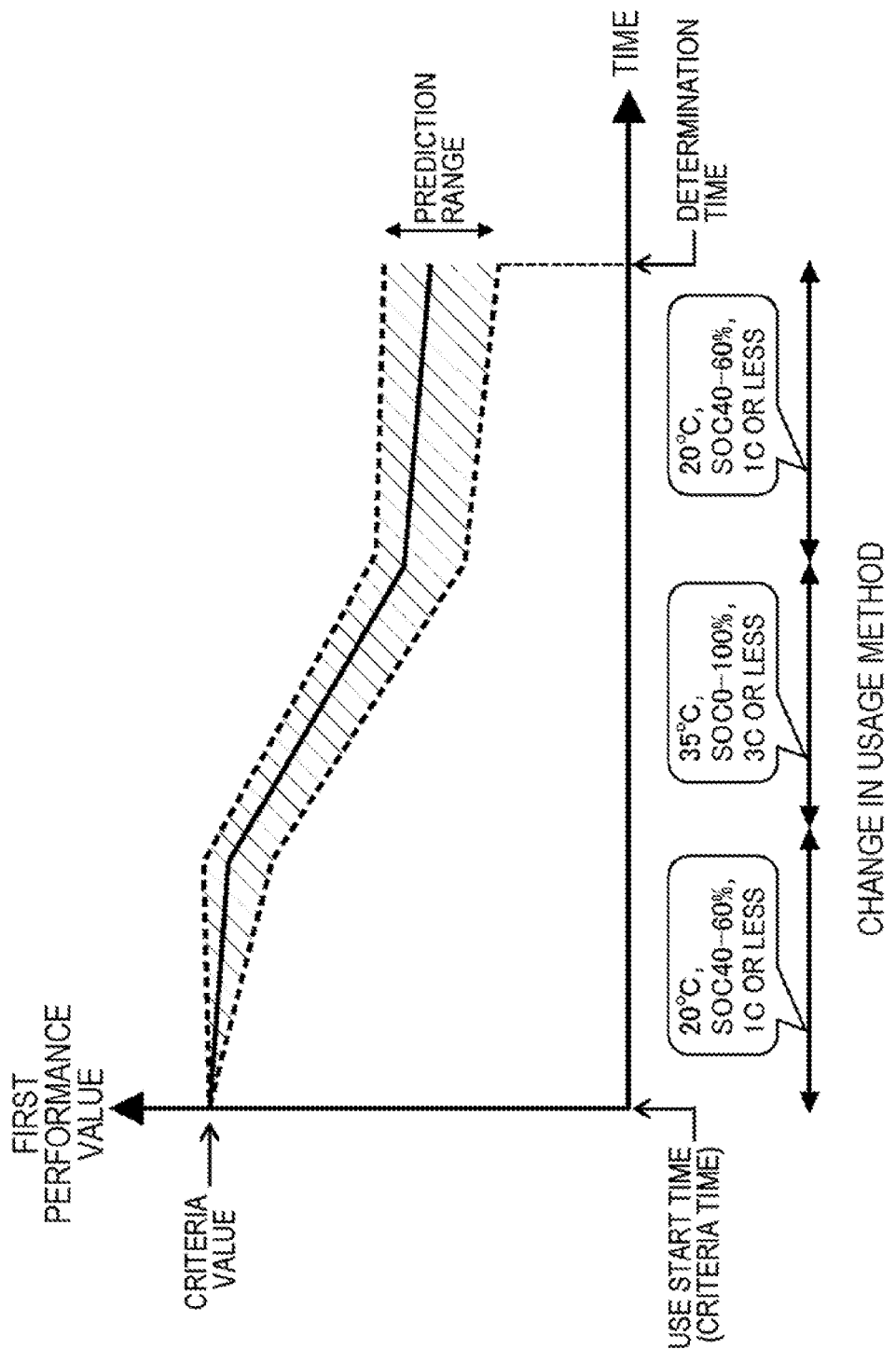
FIG. 4 is a diagram for explaining processing contents of the determination apparatus of the present example embodiment.

As illustrated in FIG. 4, the determination apparatus 10 of the present example embodiment, on the basis of the state (criteria value) of the first performance of the storage battery at the criteria time when the use is started, the usage method data indicating the usage method of the storage battery from the criteria time to the determination time, and the elapsed time from the criteria time to the determination time, can predict the state (prediction range) of the first performance at the determination time when natural deterioration occurs in the first performance when the storage battery is used in the method indicated by the usage method data. Then, when the state (target value) of the first performance at the determination time is within the above-described prediction range, the determination apparatus 10 determines that the deterioration is natural deterioration and is not to be compensated, and when the state (target value) of the first performance at the determination time is out of the above-described prediction range, the determination apparatus 10 determines that the deterioration is to be compensated because the deterioration is abnormal deterioration. The details will be described below.

An example of the hardware configuration of the determination apparatus 10 of the present example embodiment is the same as that of the first example embodiment.

An example of the functional block diagram of the determination apparatus 10 of the present example embodiment is illustrated in FIG. 1 as in the first example embodiment. As illustrated, the determination apparatus 10 includes a criteria value acquisition unit 11, a target value acquisition unit 12, a usage method data acquisition unit 13, a prediction range computing unit 14, and a determination unit 15.

The criteria value acquisition unit 11 acquires a criteria value that is a first performance value of a storage battery at a criteria time. The criteria time of the present example embodiment is the use start time of the storage battery. The criteria value of the present example embodiment is the first performance value of the storage battery at the use start time. The use start time of the storage battery may be a concept of pinpoint timing or a concept having a predetermined time width.

The first performance value of the storage battery at the use start time may be a rated value (rated capacity, rated output, or the like) of the first performance included in the specifications of the storage battery announced by the manufacturer of the storage battery. In addition, the first performance value of the storage battery at the use start time may be a measurement value actually measured at any timing after the use of the storage battery is started. The measurement of the first performance value may be performed by a power storage system including a storage battery. In this case, the power storage system has a measurement unit which measures the first performance value. In addition, an operator may connect any measuring apparatus to the power storage system and use the measuring apparatus to measure the first performance value.

The power storage system includes a system controller, a power conditioning system (PCS), a storage battery control unit, and a storage battery. The system controller controls the entire power storage system. The PCS performs conversion of DC power/AC power. The storage battery control unit controls charging/discharging of the storage battery. The storage battery control unit is a so-called battery management unit (BMU), a battery management system (BMS), or the like.

The criteria value as described above may be stored in the power storage system. In this case, the criteria value acquisition unit 11 acquires the criteria value stored in each power storage system from each power storage system.

In addition, the criteria value may be stored in a center server that manages a plurality of storage batteries. In this case, the criteria value acquisition unit 11 requests the center server for a criteria value of a predetermined storage battery and acquires the criteria value of the storage battery.

In addition, the operator may input the criteria value through the input apparatus included in the determination apparatus 10 or the input apparatus connected to the determination apparatus 10. Then, the criteria value acquisition unit 11 may acquire the criteria value input through the input apparatus.

The other configuration of the criteria value acquisition unit 11 is the same as that of the first example embodiment.

The target value acquisition unit 12 acquires a target value that is the first performance value of the storage battery at the time of determination. The target value is the first performance value actually measured at the determination time. The measurement of the first performance value may be performed by a power storage system including a storage battery. In this case, the power storage system has a measurement unit which measures the first performance value. In addition, an operator may connect any measuring apparatus to the power storage system and use the measuring apparatus to measure the first performance value.

The target value acquisition unit 12 may receive the target value from the power storage system including the storage battery to be determined. In addition, the operator may input the target value through the input apparatus of the determination apparatus 10 or the input apparatus connected to the determination apparatus 10. Then, the target value acquisition unit 12 may acquire the target value input through the input apparatus. The other configuration of the target value acquisition unit 12 is the same as that of the first example embodiment.

The usage method data acquisition unit 13 acquires usage method data indicating the usage method of the storage battery from the criteria time to the determination time.

Here, the details of the usage method data will be described. An example of the usage method data includes data indicating how charging/discharging is performed from the criteria time to the determination time. The data indicating how charging/discharging is performed is the C rate or the like.

In this case, the usage method data is, for example, time-series data indicating the execution time and the C rate of each of a plurality of times of charging/discharging performed from the criteria time to the determination time.

Note that, the usage method data may be data obtained by editing such time-series data. For example, a plurality of C rate states may be defined on the basis of the C rate value. The usage method data may be time-series data indicating a C rate state in which the storage battery is used for each period.

For example, four C rate states may be defined, such as "first C rate state: 1C or less", "second C rate state: greater than 1C and 2C or less", "third C rate state: greater than 2C and 3C or less", and "fourth C rate state: greater than 3C". Then, the usage method data may be time-series data indicating a C rate state in which the storage battery is used for each period, such as "0:00 Jan. 1, 2017 to 14:20 Jan. 20, 2017: first C rate state", "14:20 Jan. 20, 2017 to 11:18 Feb. 3, 2017: third C rate state", "11:18 Feb. 3, 2017 to 9:38 Mar. 16, 2017: first C rate state". Note that, the illustration here is only an example, and the present invention is not limited thereto.

Another example of the usage method data includes data indicating how charging/discharging is performed, depending on the state of the storage battery from the criteria time to the determination time. The state of the storage battery is, for example, the state of charge (SOC) of the storage battery.

In this case, the usage method data is, for example, time-series data indicating the SOC of the storage battery measured at any timing from the criteria time to the determination time and the measurement timing. Examples of the measurement timing include a time of starting charging, a time of ending charging, or the like. According to the usage method data obtained by measuring the SOC at such a measurement timing, it is possible to recognize a SOC range in which the storage battery is used.

Note that, the usage method data may be data obtained by editing such time-series data. For example, a plurality of SOC ranges may be defined on the basis of the SOC of the storage battery. The usage method data may be time-series data indicating a SOC range in which the storage battery is used for each period.

For example, three SOC ranges may be defined such as "first SOC range: 0 to 100%", "second SOC range: 20 to 80%", and "third SOC range: 40 to 60%". The usage method data may be time-series data indicating a SOC range in which the storage battery is used for each period, such as "0:00 Jan. 1, 2017 to 22:18 Feb. 1, 2017: first SOC range", "22:18 Feb. 1, 2017 to 12:56 Feb. 3, 2017: second SOC range", and "12:56 Feb. 3, 2017 to 9:33 Mar. 3, 2017: first SOC range".

Another example of the usage method data includes data indicating the usage method of the storage battery depending on the state of the storage battery from the criteria time to the determination time. The state of the storage battery is, for example, the temperature of the storage battery.

In this case, the usage method data is, for example, time-series data indicating the temperature of the storage battery, which are repeatedly measured regularly or irregularly from the criteria time to the determination time and the measurement timing.

Note that, the usage method data may be data obtained by editing such time-series data. For example, a plurality of temperature states may be defined on the basis of the temperature of the storage battery. The usage method data may be time-series data indicating a temperature state in which the storage battery is used for each period.

For example, four temperature states may be defined such as "first temperature state: 20° C. or lower", "second temperature state: 20 to 35° C.", and "third temperature state: 35° C. or higher". Then, the usage method data may be time-series data indicating a temperature state in which the storage battery is used for each period, such as "0:00 Jan. 1, 2017 to 10:22 Mar. 2, 2017: first temperature state", "10:22 Mar. 2, 2017 to 22:28 Mar. 26, 2017: second temperature state", and "22:28 Mar. 26, 2017 to 5:23 Apr. 13, 2017: first temperature state".

Note that, the usage method data may be data indicating a change over time of at least one of the temperature, the C rate, and the SOC of the storage battery.

Each power storage system repeatedly measures at least one of the temperature, the C rate, and the SOC of the storage battery at a predetermined timing at which the above-described usage method data is obtained. The measurement data may be stored in the power storage system. In this case, the usage method data acquisition unit 13 acquires the measurement data from each power storage system. The usage method data acquisition unit 13 may edit the acquired measurement data and generate the above-described usage method data.

In addition, the measurement data may be transmitted from each power storage system to a center server that manages a plurality of storage batteries and stored in the center server. In this case, the usage method data acquisition unit 13 requests the center server for measurement data of a predetermined storage battery and acquires the measurement data of the storage battery. Note that, the usage method data acquisition unit 13 may edit the acquired measurement data and generate the above-described usage method data.

In addition, the operator may input the usage method data through the input apparatus of the determination apparatus 10 or the input apparatus connected to the determination apparatus 10. Then, the usage method data acquisition unit 13 may acquire the usage method data input through the input apparatus.

The other configuration of the usage method data acquisition unit 13 is the same as that in the first example embodiment.

The prediction range computing unit 14 computes the prediction range of the first performance value at the determination time on the basis of the criteria value acquired by the criteria value acquisition unit 11, the usage method data acquired by the usage method data acquisition unit 13, and the elapsed time from the criteria time to the determination time. This prediction range indicates a prediction range of the first performance value at the determination time of the storage battery when the first performance of the storage battery is naturally deteriorated by using the storage battery, whose first performance value at the criteria time is the criteria value, in the usage method indicated by the usage method data from the criteria time to the determination time. Hereinafter, an example of the process of computing the prediction range will be described.

In this example, change information indicating how the first performance value changes (decreases) over time is generated in advance for each usage state determined by the usage method data. The "usage state" can be defined by combining various types of information indicated by the usage method data, such as "first usage state: first C rate state+first SOC range+first temperature state" and "second usage state: first C rate state+first SOC range+second temperature state". The "change information" indicates, for example, the amount of decrease in the first performance value per unit time.

Then, the prediction range computing unit 14 computes the predicted value M at the determination time when the criteria value is reduced by the decrease amount of the change information corresponding to the usage state determined by the usage method data, from the criteria time to the determination time.

Further, in advance, variation information for computing the variation width of the predicted value is generated from the elapsed time from the criteria time to the determination time. The variation information may be a table in which the elapsed time from the criteria time to the determination time is associated with the variation width of the predicted value, or a computing expression for computing the variation width of the predicted value from the elapsed time from the criteria time to the determination time. As the elapsed time increases, the width of variation in the predicted value increases.

Then, the prediction range computing unit 14 computes the width W of the variation of the predicted value at the determination time on the basis of the elapsed time from the criteria time to the determination time and the variation information.

Next, the prediction range computing unit 14 computes, as a prediction range, (M−W/2) or more and (M+W/2) or less, which is a numerical range in which the numerical width is W and the median is M.

The other configuration of the prediction range computing unit 14 is the same as that of the first example embodiment.

When the target value acquired by the target value acquisition unit 12 is within the prediction range computed by the prediction range computing unit 14, the determination unit 15 determines that a defect occurring in the storage battery to be determined, that is, the first performance deterioration is not to be compensated. On the other hand, when the target value is out of the above prediction range, it is determined that a defect occurring in the storage battery to be determined, that is, the first performance deterioration is to be compensated.

An example of the processing flow of the determination apparatus 10 of the present example embodiment is similar to that of the first example embodiment.

According to the determination apparatus 10 of the present example embodiment described above, it is possible to achieve the same advantageous effects as those of the first example embodiment. Further, by using the usage method data indicating a change over time of at least one of the temperature, the C rate, and the SOC of the storage battery, the prediction range of the first performance value at the determination time when the storage battery is naturally deteriorated can be computed with high accuracy. As a result, abnormal deterioration and natural deterioration can be distinguished with high accuracy.

Third Example Embodiment

The determination apparatus 10 of the present example embodiment performs the same process as the determination apparatus 10 of the first example embodiment, but the processing contents is made more concrete.

Figure 5:
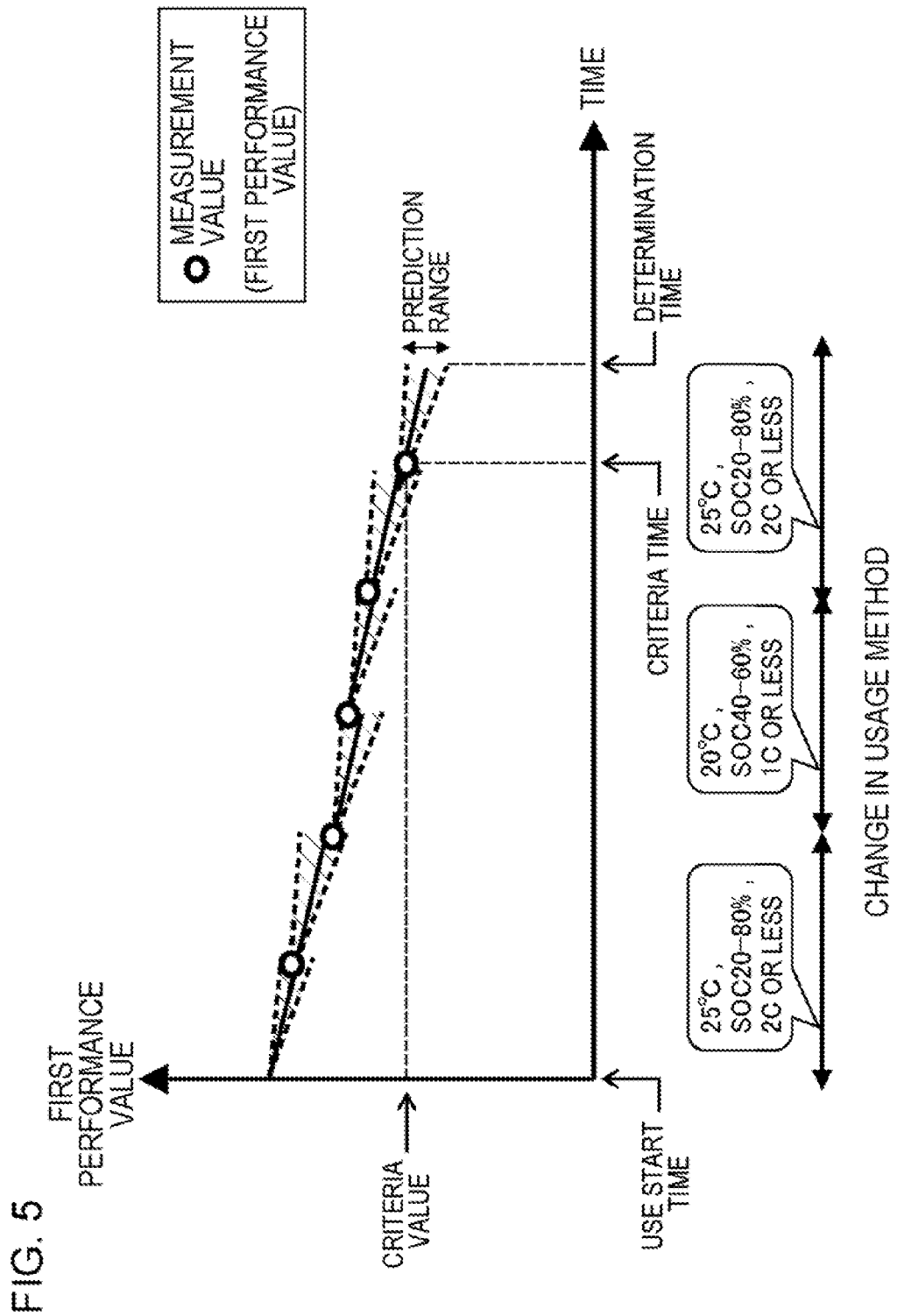
FIG. 5 is a diagram for explaining the processing contents of the determination apparatus of the present example embodiment.

The determination apparatus 10 of the present example embodiment determines whether or not the deterioration of the storage battery is to be compensated through the same process as in the second example embodiment, but as illustrated in FIG. 5, is different from that of the second example embodiment in using, as the criteria value, any one of the plurality of measurement values (first performance values) that are repeatedly measured regularly or irregularly. The details will be described below.

An example of the hardware configuration of the determination apparatus 10 of the present example embodiment is the same as that of the first and second example embodiments.

An example of the functional block diagram of the determination apparatus 10 of the present example embodiment is illustrated in FIG. 1 as in the first and second example embodiments. As illustrated, the determination apparatus 10 includes a criteria value acquisition unit 11, a target value acquisition unit 12, a usage method data acquisition unit 13, a prediction range computing unit 14, and a determination unit 15. The configurations of the target value acquisition unit 12, the usage method data acquisition unit 13, the prediction range computing unit 14, and the determination unit 15 are the same as those in the first and second example embodiments.

The criteria value acquisition unit 11 acquires a criteria value that is a first performance value of a storage battery at a criteria time. In the present example embodiment, as illustrated in FIG. 5, the first performance value of the storage battery is repeatedly measured periodically or irregularly. Then, the criteria value acquisition unit 11 acquires, as the criteria value, any one of the plurality of first performance values that are repeatedly measured regularly or irregularly. For example, the criteria value acquisition unit 11 may acquire the first performance value measured most recently as the criteria value.

The first performance value that is repeatedly measured regularly or irregularly may be stored in the power storage system. In this case, the criteria value acquisition unit 11 acquires from each power storage system, a predetermined first performance value (for example, the first performance value measured most recently), among the first performance values stored in the respective power storage systems.

In addition, the first performance value that is repeatedly measured regularly or irregularly may be stored in a center server that manages a plurality of storage batteries. In this case, the criteria value acquisition unit 11 requests the center server for a predetermined first performance value of a predetermined storage battery (for example, the first performance value measured most recently), and acquires the first performance value of the storage battery.

In addition, the operator may input the criteria value through the input apparatus included in the determination apparatus 10 or the input apparatus connected to the determination apparatus 10. Then, the criteria value acquisition unit 11 may acquire the criteria value input through the input apparatus.

The other configuration of the criteria value acquisition unit 11 is the same as that of the first example embodiment.

An example of the processing flow of the determination apparatus 10 of the present example embodiment is similar to that of the first example embodiment.

According to the determination apparatus 10 of the present example embodiment described above, it is possible to achieve the same advantageous effects as those of the first and second example embodiments.

Further, in the case of the present example embodiment illustrated in FIG. 5, the elapsed time from the criteria time to the determination time can be made shorter than in the second example embodiment illustrated in FIG. 4. In this case, the width of the prediction range computed by the prediction range computing unit 14 becomes small. That is, it is possible to accurately compute the prediction range of the first performance value at the determination time in the case of natural deterioration. As a result, it is possible to accurately determine whether deterioration is natural deterioration or abnormal deterioration.

Fourth Example Embodiment

First, an outline of a determination apparatus of the present example embodiment will be described. As in the first to third example embodiments, the service for compensating for defects in the storage battery of the present example embodiment compensates for the deterioration of the first performance value of the storage battery. However, natural deterioration is not to be compensated, and abnormal deterioration is to be compensated. Natural deterioration and abnormal deterioration have the same definitions as in the first to third example embodiments.

Then, the determination apparatus of the present example embodiment determines whether the deterioration in the first performance occurring in the storage battery to be determined is to be compensated on the basis of the state of the first performance of the storage battery to be determined at the determination time, and the state of the first performance at the determination time of the plurality of reference storage batteries used in the same usage method as the storage battery to be determined, from the criteria time to the determination time.

By considering not only the state of a first performance of the storage battery to be determined at the determination time, but also the state of the first performance of a plurality of reference storage batteries at the determination time, it is possible to accurately determine whether the deterioration occurring in the storage battery is natural deterioration or abnormal deterioration. As a result, it is possible to make a reasonable conclusion for both the service provider who provides the service for compensating the defect in the storage battery and the user of the storage battery who receives the service. The details will be described below.

An example of the hardware configuration of the determination apparatus 10 of the present example embodiment is the same as that of the first to third example embodiments.

Figure 6:
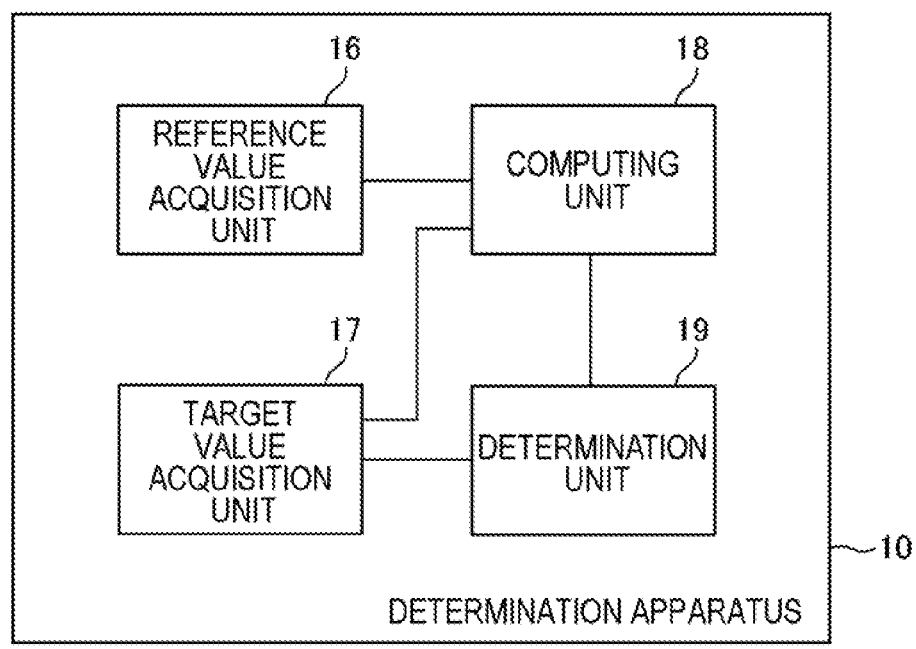
FIG. 6 is an example of a functional block diagram of the determination apparatus of the present example embodiment.

An example of the functional block diagram of the determination apparatus 10 of the present example embodiment is illustrated in FIG. 6. As illustrated, the determination apparatus 10 includes a reference value acquisition unit 16, a target value acquisition unit 17, a computing unit 18, and a determination unit 19.

The target value acquisition unit 17 acquires a target value that is a first performance value of a storage battery to be determined at a determination time. Hereinafter, the "storage battery to be determined" is referred to as the "target storage battery". The configuration of the target value acquisition unit 17 is the same as the configurations of the target value acquisition unit 12 described in the first to third example embodiments.

The reference value acquisition unit 16 acquires the first performance values of a plurality of reference storage batteries at the determination time, as reference values. The "determination time" here is a determination time for determining whether or not the deterioration in the first performance occurring in the target storage battery is to be compensated.

The "reference storage battery" is a storage battery used in the same usage method as the target storage battery, from the criteria time to the determination time. For example, when one of the plurality of storage batteries included in a large-scale power storage system is the target storage battery, another storage battery included in the large-scale power storage system can be used as the reference storage battery. Examples of the large-scale power storage system include a container-type power storage system or the like, but are not limited thereto. As in this example, the reference storage battery may be a storage battery included in the same power storage system as the target storage battery. Note that, the reference storage battery may be a storage battery included in a power storage system different from the target storage battery.

The "reference value" is the first performance value of the reference storage battery actually measured at the determination time. The measurement of the first performance value may be performed by a power storage system configured to include a reference storage battery. In this case, the power storage system has a measurement unit which measures the first performance value. In addition, an operator may connect any measuring apparatus to the power storage system and use the measuring apparatus to measure the first performance value.

The reference value acquisition unit 16 can acquire the first performance value of the reference storage battery from the power storage system. For example, from the power storage system including the target storage battery, the reference value acquisition unit 16 may acquire, as a reference value, the first performance value of another storage battery included in the power storage system.

In addition, the reference value acquisition unit 16 may extract the reference storage battery which is the storage battery used by the same usage method as the target storage battery, from the criteria time to the determination time, by collating the usage method data of the target storage battery from the criteria time to the determination time with the usage method data of another storage battery. Then, the reference value acquisition unit 16 may request the power storage system including the extracted reference storage battery for the first performance value at the determination time and acquire the same. The usage method data is as described in the first to third example embodiments. The usage method data of each of the plurality of storage batteries may be stored in a center server that manages the plurality of storage batteries. Then, the reference value acquisition unit 16 may extract the reference storage battery, using the usage method data stored in the center server.

In addition, the operator may input the reference value through the input apparatus of the determination apparatus 10 or the input apparatus connected to the determination apparatus 10. Then, the reference value acquisition unit 16 may acquire the reference value input through the input apparatus.

The computing unit 18 computes the degree of variation of a plurality of values. The plurality of values include the plurality of reference values acquired by the reference value acquisition unit 16 and the target value acquired by the target value acquisition unit 17. The computing unit 18 can compute the standard deviation or the variance of the plurality of values, as the degree of the variation of the plurality of values.

The determination unit 19 determines, on the basis of the degree of variation computed by the computing unit 18 and the target value acquired by the target value acquisition unit 17, whether the deterioration of the first performance of the target storage battery is to be compensated. Specifically, the determination unit 19 determines that the deterioration of the first performance of the target storage battery is to be compensated, when the target value indicates an abnormal value and the degree of variation is equal to or higher than the criteria level.

By determining whether or not the target value indicates an abnormal value, it is possible to determine whether or not the first performance of the target storage battery has deteriorated significantly enough to cause abnormal deterioration.

Then, by determining whether the degree of variation of the plurality of values including the plurality of reference values and the target value is equal to or higher than the criteria level, it is possible to determine whether the large deterioration is a natural deterioration due to the usage method or an abnormal deterioration due to a problem unique to the target storage battery. In the case of natural deterioration, the first performance of the reference storage battery is also greatly deteriorated, and therefore the degree of variation is small. On the other hand, in the case of abnormal deterioration, the first performance of the reference storage battery is not greatly deteriorated, and therefore the degree of variation is large.

The determination unit 19 may hold in advance abnormal value information indicating the numerical range of the first performance value that is recognized as an abnormal value. Then, the determination unit 19 may determine whether or not the target value indicates an abnormal value, by determining whether or not the target value is included in the numerical range indicated by the abnormal value information.

Note that, the abnormal value information may be information that determines the numerical range of the first performance value that is recognized as an abnormal value based on the usage period of the storage battery. For example, the abnormal value information may be a table in which the period of use of the storage battery is associated with the numerical range of the first performance value that is recognized as an abnormal value, or a computing expression for computing the upper limit and the lower limit of the numerical range of the first performance value that is recognized as an abnormal value from the period of use of the storage battery. Then, the determination unit 19 may determine the numerical range of the first performance value that is recognized as an abnormal value, on the basis of the usage period of the target storage battery and the abnormal value information. The usage period of the target storage battery may be input to the determination apparatus 10 by the operator, or may be input to the determination apparatus 10 by another method.

In addition, the determination unit 19 may determine the numerical range of the first performance value to be recognized as an abnormal value, on the basis of a plurality of reference values. For example, the determination unit 19 may determine, as the numerical range of the first performance value to be recognized as an abnormal value, a value that is separated from the statistical values of the plurality of reference values by a predetermined value or more. Examples of the statistical value include, but are not limited to, an average value, a mode, a median, and the like.

The determination unit 19 also holds variation information indicating the criteria level of the degree of variation. "The degree of variation is equal to or higher than the criteria level" means that the standard deviation is equal to or higher than a threshold, the variance is equal to or higher than a threshold, or the like. The criteria level of the degree of variation indicated by the variation information is a standard deviation threshold, a variance threshold, or the like. The determination unit 19 determines whether or not the degree of variation computed by the computing unit 18 is equal to or higher than the criteria level, on the basis of the variation information.

Note that, the variation information may be information that determines the criteria level of the degree of variation from the usage period of the storage battery. For example, the variation information may be a table in which the usage period of the storage battery is associated with a criteria level of the degree of variation, or a computing expression for computing the criteria level of the degree of variation from the usage period of the storage battery. Then, the determination unit 19 may determine the criteria level of the degree of variation on the basis of the usage period of the target storage battery and the variation information. The usage period of the target storage battery may be input to the determination apparatus 10 by the operator, or may be input to the determination apparatus 10 by another method.

The determination unit 19 can output the determination result. The output of the determination result is enabled through any output apparatus such as a display, a speaker, a printer, a projection apparatus, and a mailer.

Figure 7:
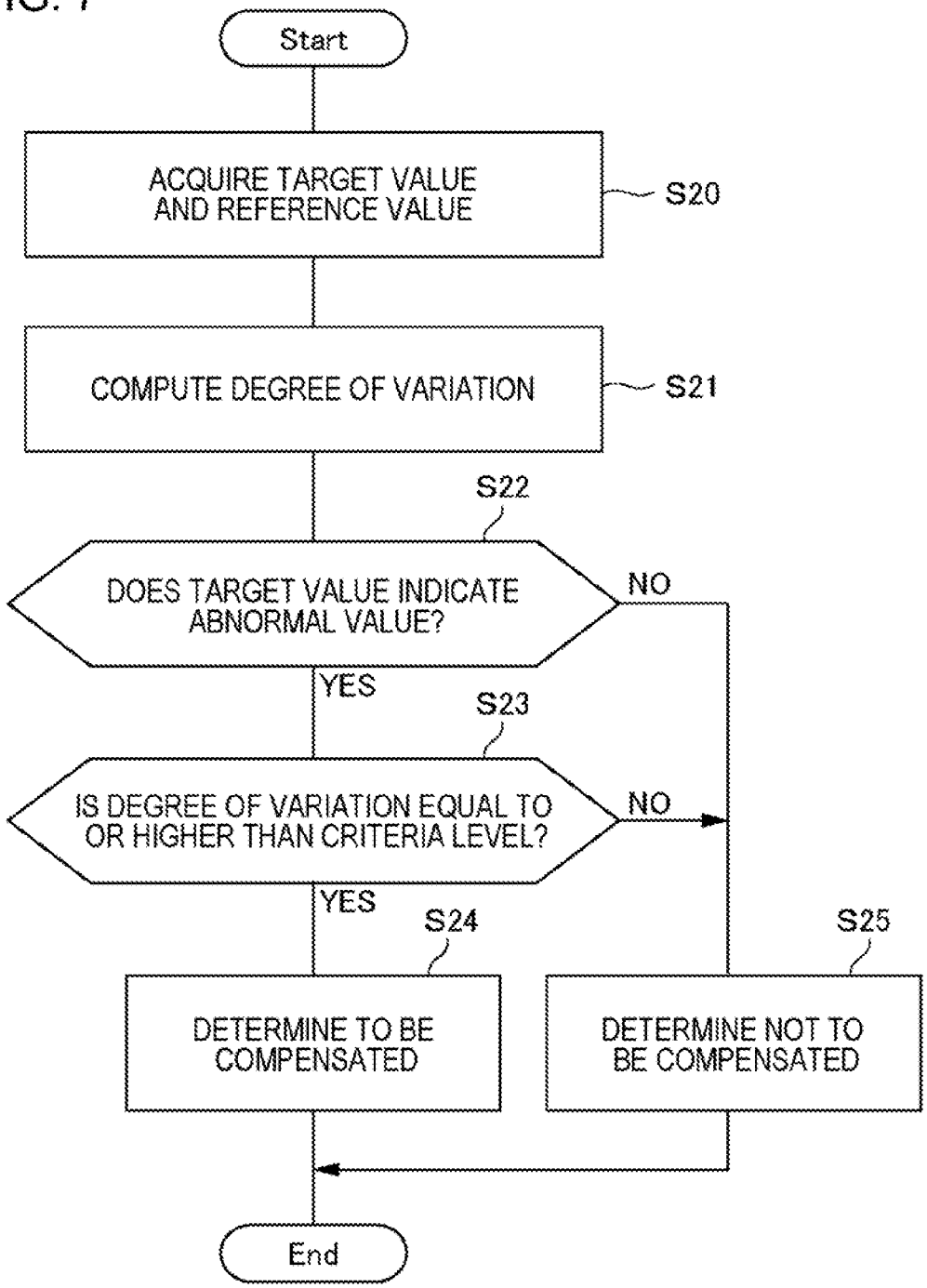
FIG. 7 is a flowchart illustrating an example of a processing flow of the determination apparatus of the present example embodiment.

Next, an example of the processing flow of the determination apparatus 10 of the present example embodiment will be described with reference to the flowchart of FIG. 7.

In S20, the target value acquisition unit 17 acquires a target value that is the first performance value of the target storage battery at the determination time. Further, in S20, the reference value acquisition unit 16 acquires the reference values that are the first performance values of the plurality of reference storage batteries at the determination time.

In S21, the computing unit 18 computes the degree of variation in the plurality of values. The plurality of values include the plurality of reference values and the target value. The degree of variation is the standard deviation or variance of the plurality of values.

In S22, the determination unit 19 determines whether the target value indicates an abnormal value. For example, the determination unit 19 determines the numerical range that is determined to be an abnormal value in the method described above, and determines whether the target value indicates an abnormal value, by determining whether the target value is included in the numerical range.

When the target value does not indicate an abnormal value (No in S22), the determination unit 19 determines that the deterioration in the first performance occurring in the target storage battery is not to be compensated (S25).

On the other hand, when the target value indicates an abnormal value (Yes in S22), the determination unit 19 determines whether the degree of variation computed in S21 is equal to or higher than the criteria level (S23). For example, the determination unit 19 can determine the criteria level of the degree of variation on the basis of the variation information described above.

When the degree of variation is equal to or higher than the criteria level (Yes in S23), the determination unit 19 determines that the deterioration in the first performance occurring in the target storage battery is to be compensated (S24).

On the other hand, when the degree of variation is less than the criteria level (No in S23), the determination unit 19 determines that the deterioration in the first performance occurring in the target storage battery is not to be compensated (S25).

According to the determination apparatus 10 of the present example embodiment described above, by considering not only the state of a first performance of the target storage battery at the determination time, but also the state of the first performance at the determination time of a plurality of reference storage batteries used in the same usage method as the usage method of the target storage battery, from the criteria time to the determination time, it is possible to accurately determine whether the deterioration occurring in the target storage battery is natural deterioration or abnormal deterioration. As a result, it is possible to make a reasonable conclusion for both the service provider who provides the service for compensating the defect in the storage battery and the user of the storage battery who receives the service. That is, the service for compensating for the trouble in the storage battery can be enhanced. As a result, further popularization of storage batteries is expected.

Fifth Example Embodiment

The determination apparatus 10 of the present example embodiment performs the same process as that of the fourth example embodiment, but the determination method of the determination unit 19 is different. The details will be described below.

An example of the hardware configuration of the determination apparatus 10 of the present example embodiment is the same as that of the first to fourth example embodiments.

An example of the functional block diagram of the determination apparatus 10 of the present example embodiment is illustrated in FIG. 6 as in the fourth example embodiment. As illustrated, the determination apparatus 10 includes a reference value acquisition unit 16, a target value acquisition unit 17, a computing unit 18, and a determination unit 19.

The target value acquisition unit 17 acquires the first performance value of the target storage battery measured at each of a plurality of measurement times from the criteria time to the determination time. The acquisition of the first performance value of the target storage battery at each of a plurality of measurement times can be enabled in the same manner as the acquisition of the target value. The other configuration of the target value acquisition unit 17 is the same as that of the fourth example embodiment.

The reference value acquisition unit 16 acquires the first performance value of each of the plurality of reference storage batteries measured at each of the plurality of measurement times from the criteria time to the determination time. The acquisition of the first performance value of the reference storage battery at each of a plurality of measurement times can be enabled in the same manner as the acquisition of the reference value. The other configuration of the reference value acquisition unit 16 is the same as that of the fourth example embodiment.

The computing unit 18 computes the degree of variation in a plurality of values including the first performance value of the target storage battery and the first performance value of each of the plurality of reference storage batteries at each measurement time described above. The computing of the degree of variation can be enabled in the same manner as the computing of the degree of variation of a plurality of values including the target value and the plurality of reference values. The other configuration of the computing unit 18 is the same as that of the fourth example embodiment.

When the target value indicates an abnormal value and the change over time of the degree of variation between the criteria time and the determination time satisfies the predetermined condition, the determination unit 19 determines that the deterioration in the first performance occurring in the target storage battery is to be compensated. The determination as to whether the target value indicates an abnormal value is the same as in the fourth example embodiment.

Here, the determination as to whether or not the change over time of the degree of variation from the criteria time to the determination time satisfies the predetermined condition will be described.

The predetermined condition may be "there is a portion where the amount of change in the degree of variation is equal to or more than a threshold between the criteria time and the determination time". The "amount of change in the degree of variation" is a difference between the degree of variation at the N-th measurement and the degree of variation at the (N+1)-th measurement (N is an integer of 1 or more).

In addition, the predetermined condition may be "there is a portion where the rate of change in the degree of variation is equal to or more than a threshold between the criteria time and the determination time". The "rate of change in the degree of variation" is, for example, a value obtained by dividing a difference between the degree of variation at the N-th measurement and the degree of variation at the (N+1)-th measurement by the degree of variation in the N-th measurement.

Similar to the fourth example embodiment, by determining whether or not the target value indicates an abnormal value, it is possible to determine whether or not the first performance of the target storage battery has deteriorated significantly enough to cause abnormal deterioration.

Figure 8:
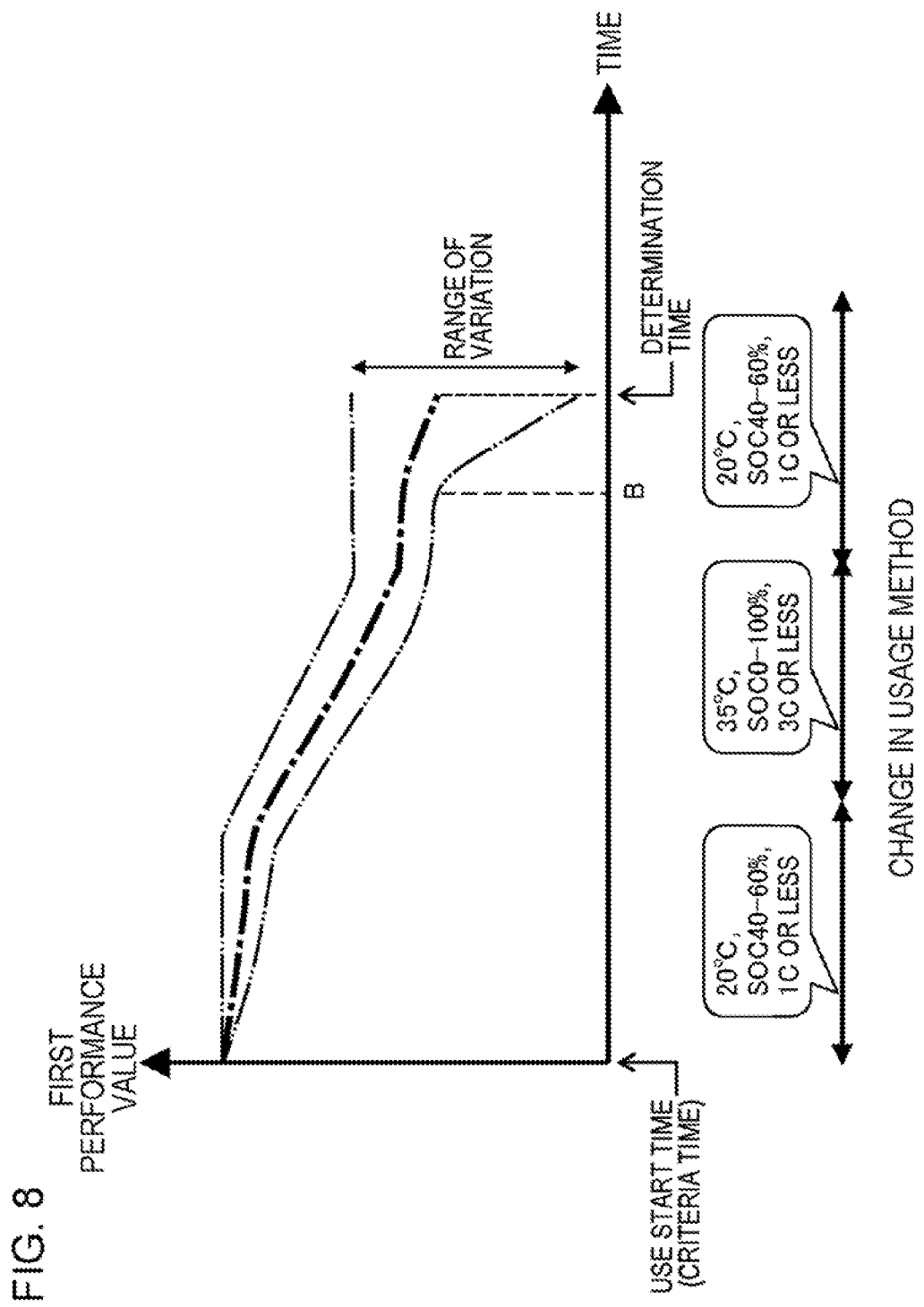
FIG. 8 is a diagram for explaining the processing contents of the determination apparatus of the present example embodiment.

Then, by determining whether or not the change over time of the degree of variation from the criteria time to the determination time satisfies a predetermined condition, it is possible to determine whether the large deterioration is a natural deterioration due to the usage method or an abnormal deterioration due to a problem unique to the target storage battery. In the case of natural deterioration, the deterioration of the first performance of the target storage battery and the plurality of reference storage batteries indicates the same change over time, so that the degree of variation remains without significant change. On the other hand, in the case of abnormal deterioration, the deterioration of the first performance of the target storage battery and the plurality of reference storage batteries indicates different changes over time at the time of occurrence of the abnormality, so that as illustrated in FIG. 8, there is a point B where the degree of variation (illustrated "range of variation") changes significantly.

Figure 9:
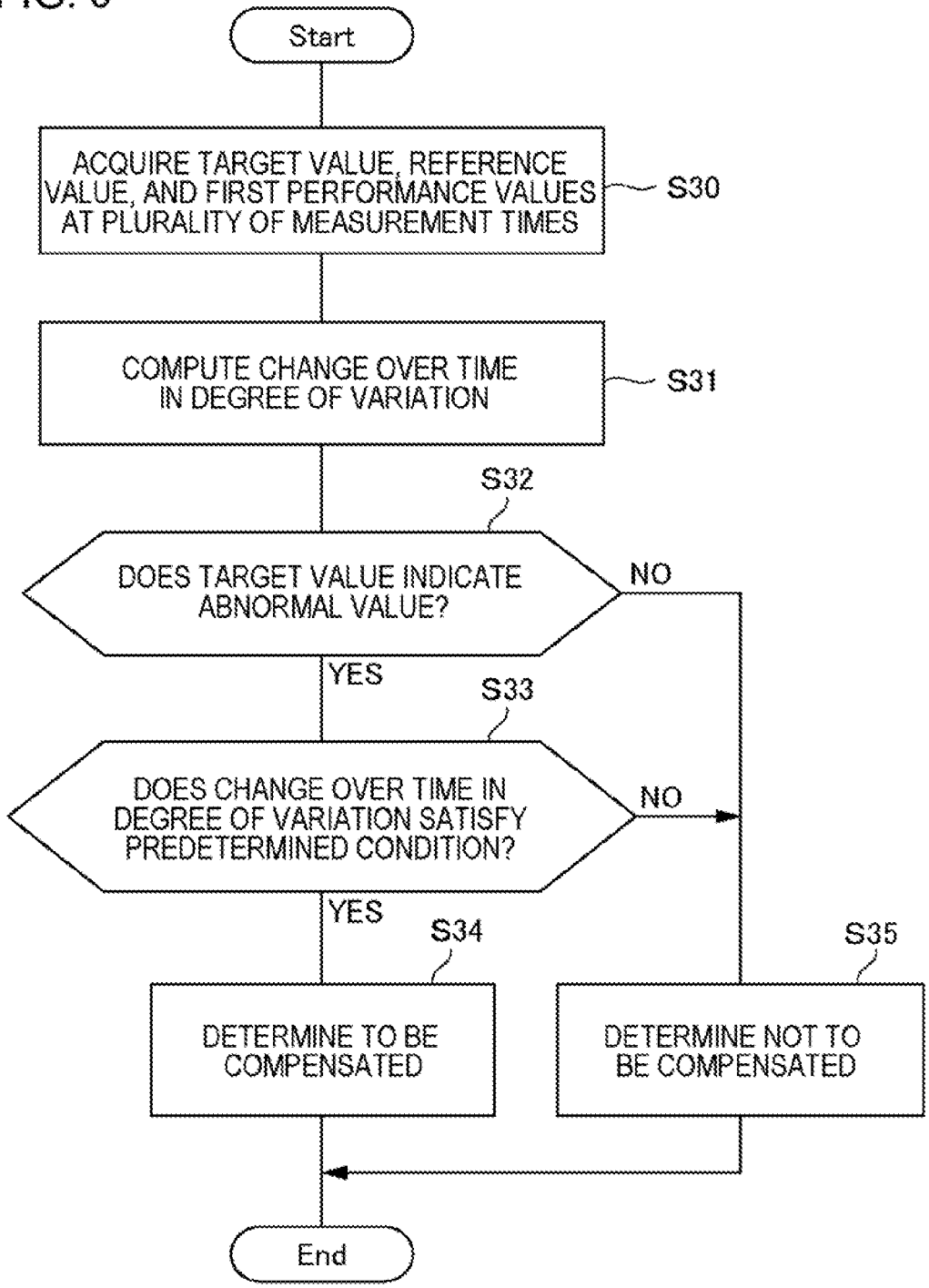
FIG. 9 is a flowchart illustrating an example of a processing flow of the determination apparatus of the present example embodiment.

Next, an example of the processing flow of the determination apparatus 10 of the present example embodiment will be described with reference to the flowchart of FIG. 9.

In S30, the target value acquisition unit 17 acquires a target value that is the first performance value of the target storage battery at the determination time. Further, in S30, the target value acquisition unit 17 acquires the first performance value of the target storage battery measured at each of a plurality of measurement times from the criteria time to the determination time. Further, in S30, the reference value acquisition unit 16 acquires the reference values that are the first performance values of the plurality of reference storage batteries at the determination time. Further, in S30, the reference value acquisition unit 16 acquires the first performance value of the reference storage battery measured at each of a plurality of measurement times from the criteria time to the determination time.

In S31, the computing unit 18 computes the degree of variation in the plurality of values. The computing unit 18 computes the degree of variation of a plurality of values including a plurality of reference values and the target values. In addition, the computing unit 18 computes the degree of variation in a plurality of values including the first performance value of the target storage battery and the first performance value of the reference storage battery at each measurement time. The degree of variation is the standard deviation or variance of the plurality of values.

In S32, the determination unit 19 determines whether the target value indicates an abnormal value. For example, the determination unit 19 determines the numerical range that is determined to be an abnormal value in the method described in the fourth example embodiment, and determines whether the target value indicates an abnormal value, by determining whether the target value is included in the numerical range.

When the target value does not indicate an abnormal value (No in S32), the determination unit 19 determines that the deterioration in the first performance occurring in the target storage battery is not to be compensated (S35).

On the other hand, when the target value indicates an abnormal value (Yes in S32), the determination unit 19 determines, on the basis of the result computed in S31, that the change over time of degree of variation from the criteria time to the determination time satisfies the predetermined condition. The predetermined condition may be that "there is a point where the amount of change in the degree of variation is equal to or more than a threshold between the criteria time and the determination time" or "there is a point where the rate of change in the degree of variation is equal to or more than a threshold between the criteria time and the determination time".

When the predetermined condition is satisfied (Yes in S33), the determination unit 19 determines that the deterioration in the first performance occurring in the target storage battery is to be compensated (S34).

On the other hand, when the predetermined condition is not satisfied (No in S33), the determination unit 19 determines that the deterioration in the first performance occurring in the target storage battery is not to be compensated (S35).

According to the determination apparatus 10 of the present example embodiment described above, it is possible to achieve the same advantageous effects as those of the fourth example embodiment.

Sixth Example Embodiment

An example of the hardware configuration of the determination apparatus 10 of the present example embodiment is the same as that of the first to fifth example embodiments.

An example of the functional block diagram of the determination apparatus 10 of the present example embodiment is illustrated in FIG. 6. As illustrated, the determination apparatus 10 includes a reference value acquisition unit 16, a target value acquisition unit 17, a computing unit 18, and a determination unit 19. The configuration of the target value acquisition unit 17 is the same as that of the fourth and fifth example embodiments.

The reference value acquisition unit 16 acquires the first performance values of a plurality of reference storage batteries at the determination time, as reference values. The "determination time" here is a determination time for determining whether or not the deterioration in the first performance occurring in the target storage battery is to be compensated.

The "reference storage battery" has an attribute common to the target storage battery. Examples of common attributes include, but are not limited to, the same lot, the same manufacturing date, the same manufacturing factory, the same storage warehouse, the same vendor, the same transportation company, and the like. Further, the reference storage battery is a storage battery used in the same usage method as the target storage battery from the criteria time to the determination time. It is considered that the reference storage battery and the target storage battery like this have the same aspect of deterioration. The "reference value" is the first performance value of the reference storage battery actually measured at the determination time.

The following may be considered as means for the reference value acquisition unit 16 that acquires the reference values of the plurality of reference storage batteries. For example, the operator may input the reference values of the plurality of reference storage batteries into the determination apparatus 10. In addition, the determination apparatus 10 may acquire reference values of a plurality of reference storage batteries from the server. In the case of this example, the server may periodically collect the first performance value of each of the plurality of storage batteries from the plurality of power storage systems. Further, the server may periodically collect usage method data indicating the usage method of each of the plurality of storage batteries from the plurality of power storage systems. Further, the server may store information indicating the above attributes of a plurality of storage batteries. Then, the server may extract a storage battery that has the attribute common to the target storage battery and is used in the same usage method as the target storage battery on the basis of the held information, and may transmit the extracted first performance value of the storage battery, as a reference value, to the determination apparatus 10.

Figure 11:
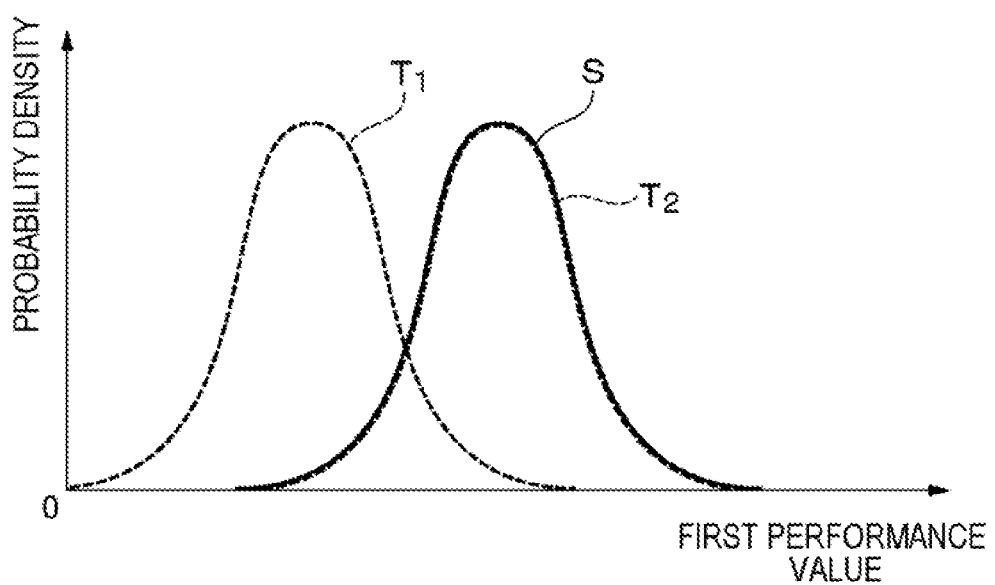
FIG. 11 is a diagram for explaining the processing contents of the determination apparatus of the present example embodiment.

In the present example embodiment, it is determined whether or not the deterioration of the target storage battery is natural deterioration, on the basis of the reference values of the plurality of reference storage batteries and the target value of the target storage battery. The concept of determination according to the present example embodiment will be described with reference to FIG. 11. S indicates a reference distribution, and is a probability density distribution of the first performance value of the storage battery when the storage battery is used for the same time in the same method as the time and method of the target storage battery and is naturally deteriorated. By performing in advance a test for using a plurality of storage batteries in a plurality of usage methods respectively to be naturally deteriorated, and periodically measuring the first performance value during the natural deterioration, the probability density distribution of the first performance value at each of a plurality of timings is obtained for each usage method.

T1 and T2 represent actual distributions of values including a plurality of reference values and a target value. When the plurality of reference batteries and the target battery are naturally deteriorated, the actual distribution is T2. That is, the position of the actual distribution T2 and the position of the reference distribution S substantially match. On the other hand, when the plurality of reference batteries and the target battery are abnormally deteriorated and the deterioration is promoted, the actual distribution is T1. That is, the position of the actual distribution T1 is shifted to the position where the performance is worse than that of the reference distribution S. In the present example embodiment, the phenomenon is used to determine whether the deterioration of the target storage battery is natural deterioration or abnormal deterioration. That is, when the deviation between the reference distribution A and the actual distribution is within the criteria level, it is determined as natural deterioration, and when the deviation exceeds the criteria level, it is determined as abnormal deterioration.

For example, the computing unit 18 may compute statistical values (for example, a mode, a median, or the like) of a plurality of values including the plurality of reference values acquired by the reference value acquisition unit 16 and the target value acquired by the target value acquisition unit 17. Then, the determination unit 19 may compare the statistical value with the statistical value (criteria value) of the measurement data obtained by performing a test for obtaining a reference distribution (probability density distribution of the first performance value of the storage battery when the storage battery is used for the same usage time in the same usage method as the usage time and method of the target storage battery and is naturally deteriorated), determine as natural deterioration if the difference is within the threshold, and may determine as abnormal deterioration if the difference is larger than the threshold. Note that, the method of determining whether or not the deviation between the reference distribution A and the actual distribution is at the criteria level is not limited to this, and other methods can be adopted.

According to the determination apparatus 10 of the present example embodiment described above, by considering not only the state of a first performance of the target storage battery at the determination time, but also the state of the first performance at the determination time of a plurality of reference storage batteries used in the same usage method as the usage method of the target storage battery, from the criteria time to the determination time, it is possible to accurately determine whether the deterioration occurring in the target storage battery is natural deterioration or abnormal deterioration. As a result, it is possible to make a reasonable conclusion for both the service provider who provides the service for compensating the defect in the storage battery and the user of the storage battery who receives the service.

That is, the service for compensating for the trouble in the storage battery can be enhanced. As a result, further popularization of storage batteries is expected.

Seventh Example Embodiment

An example of the hardware configuration of the determination apparatus 10 of the present example embodiment is the same as that of the first to sixth example embodiments.

An example of the functional block diagram of the determination apparatus 10 of the present example embodiment is illustrated in FIG. 1 or FIG. 6. The configurations of the functional units except the determination unit 15 of FIG. 1 and the determination unit 19 of FIG. 6 are the same as those of the first to sixth example embodiments.

The determination unit 15 and the determination unit 19 (hereinafter, "determination units 15 and 19") are different from those in the first to sixth example embodiments in having the function of predicting and outputting the time until the first performance value of the target storage battery reaches the lower limit. The other configurations of the determination units 15 and 19 are the same as those in the first to sixth example embodiments. Hereinafter, the functions of the determination units 15 and 19 will be described in detail.

Figure 12:
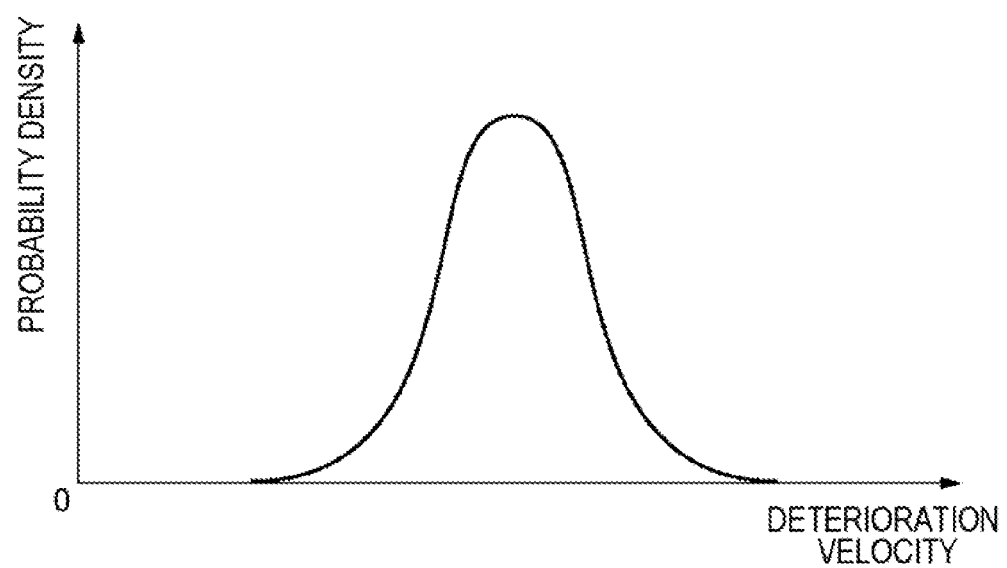
FIG. 12 is a diagram for explaining the processing contents of the determination apparatus of the present example embodiment.

In the present example embodiment, a probability density distribution of the deterioration velocity is obtained for each usage method by performing in advance a test for using a plurality of storage batteries in a plurality of usage methods respectively to be naturally deteriorated (see FIG. 12). Then, the determination units 15 and 19 use the current first performance value of the target storage battery and the probability density distribution of the deterioration velocity to predict the time until the first performance value of the target storage battery reaches the lower limit. Note that, when the usage method of the target storage battery is fixed, the determination units 15 and 19 use the probability density distribution of the deterioration velocity corresponding to the usage method to perform the above prediction. On the other hand, when the usage method of the target storage battery is changing, the determination units 15 and 19 perform the above prediction by using the probability density distribution of the deterioration velocity corresponding to any usage method such as "current usage method" or "longest-time adopted usage method".

Figure 13:
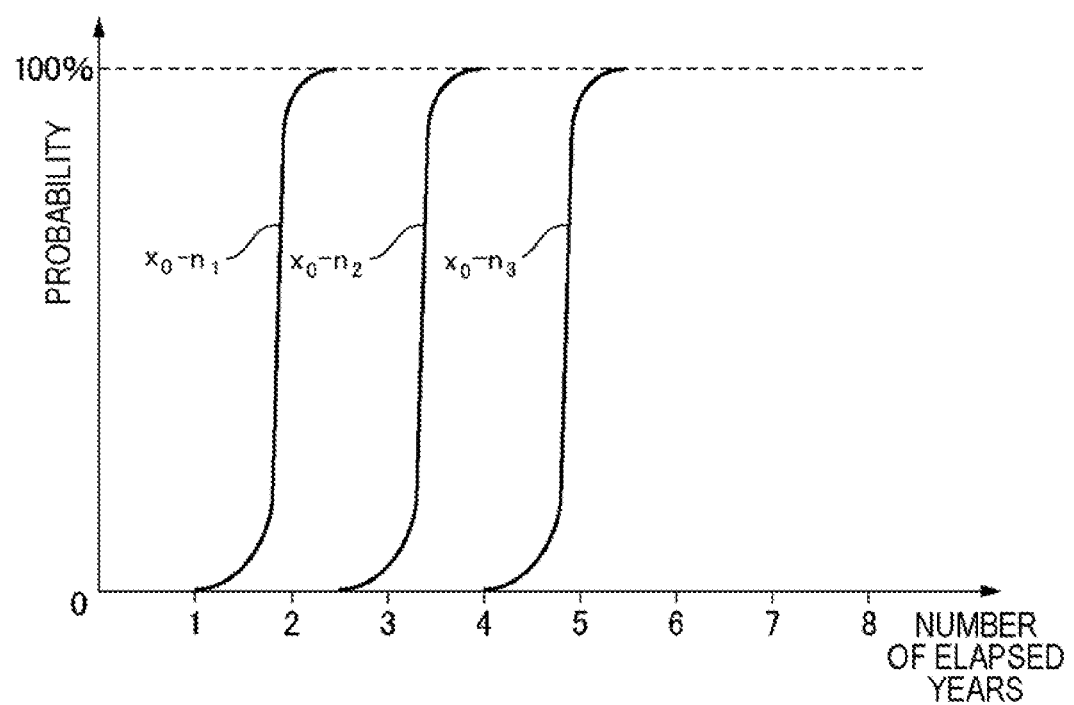
FIG. 13 is a diagram for explaining the processing contents of the determination apparatus of the present example embodiment.

By using the probability density distribution of the deterioration velocity according to a certain usage method, as illustrated in FIG. 13, the time until the first performance value of the storage battery reaches any value when the storage battery is used in that usage method (the number of elapsed years) can be predicted. x0 is the first performance value at the present time (the number of elapsed years is 0). The line corresponding to (x0-n1) represents the relationship between the number of years elapsed until the first performance value reaches (x0-n1) and its probability. Similarly, the line corresponding to (x0-n2) represents the relationship between the number of years elapsed until the first performance value reaches (x0-n2) and its probability, and the line corresponding to (x0-n3) represents the relationship between the number of years elapsed until the first performance value reaches (x0-n3) and its probability.

The determination units 15 and 19 may output the number of elapsed years after which the probability of the first performance value of the target storage battery reaching the lower limit is greater than 0 and 100% or less, as the predicted value of time until the first performance value of the target storage battery reaches the lower limit (for example, x0-n3). In the illustrated example, the predicted value of the time until the first performance value reaches (x0-n3) is about 4 years to about 5.5 years.

According to the determination apparatus 10 of the present example embodiment described above, it is possible to achieve the same advantageous effects as those of the first to sixth example embodiments. Further, according to the determination apparatus 10 of the present example embodiment, it is possible to compute and output the predicted value of the time until the first performance value of the target storage battery reaches the lower limit.

Example

Figure 10:
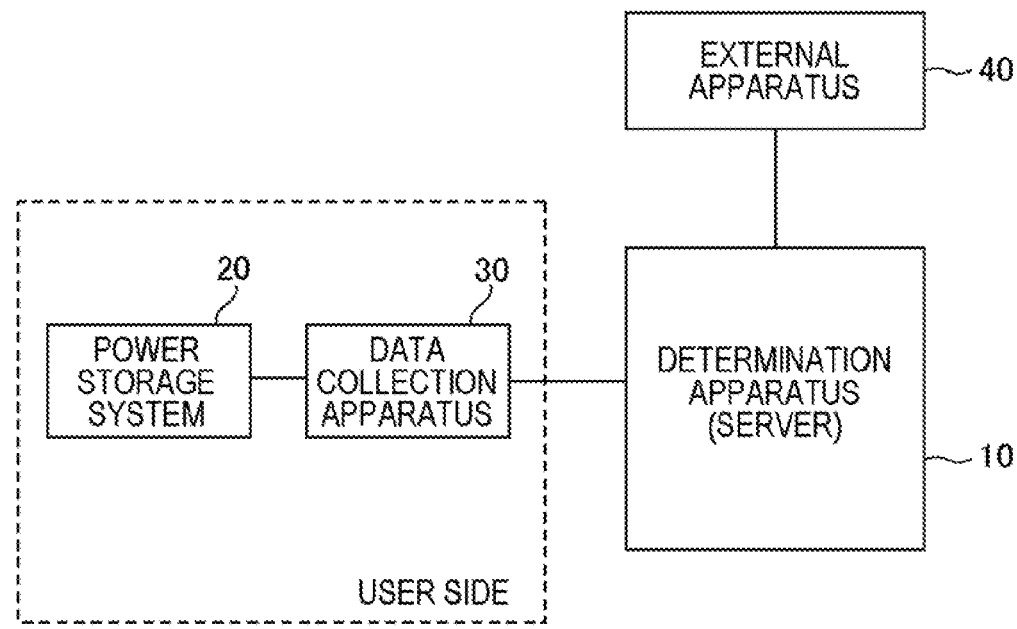
FIG. 10 is a diagram for explaining an example of the determination apparatus of the present example embodiment.

Here, an example of the determination apparatus 10 of the present example embodiment will be described with reference to FIG. 10. The determination apparatus 10 is a server. The determination apparatus 10 is configured to be communicable with the data collection apparatus 30 installed on the side of the user who uses the power storage system 20.

The data collection apparatus 30 is configured to be communicable with the power storage system 20, and acquires various types of information regarding the power storage system 20 from the power storage system 20. Examples of various types of information include, but are not limited to, information registered in the power storage system, measurement values measured by a sensor included in the power storage system or a sensor connected to the power storage system, and information input by the operator to the power storage system.

The determination apparatus 10 acquires the various types of information from the data collection apparatus 30. Note that, although one set of data collection apparatus 30 and power storage system 20 is illustrated in FIG. 10, a plurality of sets of data collection apparatus 30 and power storage system 20 are configured to be communicable with the determination apparatus 10. Then, the determination apparatus 10 acquires, from each of the plurality of data collection apparatuses 30, various types of information regarding the power storage system 20 connected to each data collection apparatus 30.

The determination apparatus 10 executes the processes described in the first to fifth example embodiments on the basis of the information received from the data collection apparatus 30 or the information input through the input apparatus included in the determination apparatus 10 or the input apparatus connected to the determination apparatus 10.

The determination apparatus 10 is configured to be communicable with an external apparatus 40. The external apparatus 40 is, for example, an apparatus of a service provider that provides a service of compensating for deterioration of the storage battery. The determination apparatus 10 transmits to the external apparatus 40, the determination results by the determination unit 15 described in the first to third example embodiments or the determination unit 19 described in the fourth and fifth example embodiments.

A modification example of the example will be described. The determination apparatus 10 may be provided in the power storage system 20. That is, each power storage system 20 may determine whether or not the deterioration in the first performance occurring in the storage battery included in each power storage system 20 is to be compensated.

Hereinafter, examples of the reference aspects will be additionally described.

1. A determination apparatus including:
a criteria value acquisition unit which acquires a criteria value that is a first performance value of a storage battery at a criteria time;
a target value acquisition unit which acquires a target value that is the first performance value of the storage battery at a determination time;
a usage method data acquisition unit which acquires usage method data indicating a usage method of the storage battery from the criteria time to the determination time;
a predicted range computing unit which computes a predicted range of the first performance value at the determination time on the basis of the criteria value, the usage method data, and a time elapsed from the criteria time to the determination time; and
a determination unit which determines that the storage battery is not to be compensated if the target value is within the predicted range and that the storage battery is to be compensated if the target value is outside the predicted range.

2. The determination apparatus according to 1,
in which the criteria value acquisition unit acquires, as the criteria value, the first performance value of the storage battery at the use start time of the storage battery.

3. The determination apparatus according to 1,
in which the criteria value acquisition unit acquires, as the criteria value, any one of the first performance values of the storage battery, which are repeatedly measured regularly or irregularly.

4. The determination apparatus according to any one of 1 to 3,
in which the first performance value is any one of a storage battery capacity [Wh], a maximum input power [W], and a maximum output power [W].

5. The determination apparatus according to any one of 1 to 4,
in which the usage method data indicates a change over time of at least one of a temperature, a C rate, and a state of charge (SOC) of the storage battery.

6. A determination apparatus including:
a target value acquisition unit which acquires a target value that is a first performance value of a storage battery to be determined at a determination time;
a reference value acquisition unit which acquires, as reference values, the first performance values at the determination time of a plurality of reference storage batteries used in the same usage method as the storage battery to be determined, from a criteria time to the determination time;
a computing unit which computes a degree of variation of a plurality of values including a plurality of the reference values and the target value; and
a determination unit which determines whether or not the storage battery to be determined is to be compensated on the basis of the degree of variation and the target value.

7. The determination apparatus according to 6,
in which the determination unit determines that the storage battery to be determined is to be compensated, when the target value indicates an abnormal value and the degree of variation is equal to or higher than a criteria level.

8. The determination apparatus according to 6,
in which the target value acquisition unit acquires the first performance value of the storage battery to be determined at each of a plurality of measurement times from the criteria time to the determination time,
in which the reference value acquisition unit acquires the first performance value of each of the plurality of reference storage batteries at each of the plurality of measurement times from the criteria time to the determination time,
in which the computing unit computes the degree of variation of a plurality of values including the first performance value of the storage battery to be determined and the first performance values of the reference storage batteries at each measurement time, and
in which when the target value indicates an abnormal value and a change over time of the degree of variation from the criteria time to the determination time satisfies a predetermined condition, the determination unit determines that the storage battery to be determined is to be compensated.

9. The determination apparatus according to 7 or 8,
in which the determination unit determines the abnormal value on the basis of the plurality of reference values.

10. The determination apparatus according to 9,
in which the determination unit determines, as the abnormal value, a value that is apart from statistical values of the plurality of reference values by a predetermined value or more.

11. A determination apparatus including:
a target value acquisition unit which acquires a target value that is a first performance value of a storage battery to be determined at a determination time;
a reference value acquisition unit which acquires, as reference values, the first performance values at the determination time of a plurality of reference storage batteries used in the same usage method as the storage battery to be determined, from a criteria time to the determination time;
a computing unit which computes statistical values of a plurality of values including a plurality of the reference values and the target value; and
a determination unit which determines that the storage battery is not to be compensated if a difference between the statistic value and a criteria value is within a threshold, and that the storage battery is to be compensated if the difference is greater than the threshold.

12. The determination apparatus according to any one of 1 to 11,
in which the determination unit predicts a time until the first performance value reaches a lower limit on the basis of the target value and the usage method data.

13. A determination method executed by a computer, the method comprising:
a criteria value acquisition step of acquiring a criteria value that is a first performance value of a storage battery at a criteria time;
a target value acquisition step of acquiring a target value that is the first performance value of the storage battery at a determination time;
a usage method data acquisition step of acquiring usage method data indicating a usage method of the storage battery from the criteria time to the determination time;
a predicted range computing step of computing a predicted range of the first performance value at the determination time on the basis of the criteria value, the usage method data, and a time elapsed from the criteria time to the determination time; and
a determination step of determining that the storage battery is not to be compensated if the target value is within the predicted range and that the storage battery is to be compensated if the target value is outside the predicted range.

14. A program causing a computer to function as:
a criteria value acquisition unit which acquires a criteria value that is a first performance value of a storage battery at a criteria time;
a target value acquisition unit which acquires a target value that is the first performance value of the storage battery at a determination time;
a usage method data acquisition unit which acquires usage method data indicating a usage method of the storage battery from the criteria time to the determination time;
a predicted range computing unit which computes a predicted range of the first performance value at the determination time on the basis of the criteria value, the usage method data, and a time elapsed from the criteria time to the determination time; and
a determination unit which determines that the storage battery is not to be compensated if the target value is within the predicted range and that the storage battery is to be compensated if the target value is outside the predicted range.

15. A determination method executed by a computer, the method comprising:
a target value acquisition step of acquiring a target value that is a first performance value of a storage battery to be determined at a determination time;
a reference value acquisition step of acquiring, as reference values, the first performance values at the determination time of a plurality of reference storage batteries used in the same usage method as the storage battery to be determined, from a criteria time to the determination time;
a computing step of computing a degree of variation of a plurality of values including a plurality of the reference values and the target value; and
a determination step of determining whether or not the storage battery to be determined is to be compensated on the basis of the degree of variation and the target value.

16. A program causing a computer to function as:
a target value acquisition unit which acquires a target value that is a first performance value of a storage battery to be determined at a determination time;
a reference value acquisition unit which acquires, as reference values, the first performance values at the determination time of a plurality of reference storage batteries used in the same usage method as the storage battery to be determined, from a criteria time to the determination time;
a computing unit which computes a degree of variation of a plurality of values including a plurality of the reference values and the target value; and
a determination unit which determines whether or not storage battery to be determined is to be compensated on the basis of the degree of variation and the target value.

17. A determination method executed by a computer, the method comprising:
a target value acquisition step of acquiring a target value that is a first performance value of a storage battery to be determined at a determination time;
a reference value acquisition step of acquiring, as reference values, the first performance values at the determination time of a plurality of reference storage batteries used in the same usage method as the storage battery to be determined, from a criteria time to the determination time;
a computing step of computing statistical values of a plurality of values including a plurality of the reference values and the target value; and
a determination step of determining that the storage battery is not to be compensated if a difference between the statistic value and a criteria value is within a threshold, and that the storage battery is to be compensated if the difference is greater than the threshold.

18. A program causing a computer to function as:
a target value acquisition unit which acquires a target value that is a first performance value of a storage battery to be determined at a determination time;
a reference value acquisition unit which acquires, as reference values, the first performance values at the determination time of a plurality of reference storage batteries used in the same usage method as the storage battery to be determined, from a criteria time to the determination time;
a computing unit which computes statistical values of a plurality of values including a plurality of the reference values and the target value; and
a determination unit which determines that the storage battery is not to be compensated if a difference between the statistic value and a criteria value is within a threshold, and that the storage battery is to be compensated if the difference is greater than the threshold.

The invention claimed is:
1. A power storage system for enhanced performance compensation of a storage battery, the power storage system comprising:
a battery management system configured to control charging and discharging of the storage battery, and
an apparatus comprising:
at least one memory configured to store one or more instructions; and
at least one processor configured to execute the one or more instructions to:
acquire a criteria value that is a first performance value of the storage battery at a criteria time;
acquire a target value that is the first performance value of the storage battery at a determination time;
acquire usage method data indicating a usage method of the storage battery from the criteria time to the determination time;
compute a predicted range of the first performance value at the determination time based on the criteria value, the usage method data, and a time elapsed from the criteria time to the determination time; and
determine whether the storage battery is experiencing abnormal deterioration based on whether the target value is outside the predicted range,
wherein performance of the storage battery is selectively compensated for deterioration based on the determination of the apparatus.

2. The power storage system according to claim 1, wherein the processor is further configured to execute the one or more instructions to acquire, as the criteria value, the first performance value of the storage battery at a use start time of the storage battery.

3. The power storage system according to claim 1, wherein the processor is further configured to execute the one or more instructions to acquire, as the criteria value, any one of a plurality of first performance values of the storage battery, which are repeatedly measured regularly or irregularly.

4. The power storage system according to claim 1, wherein the first performance value is any one of a storage battery capacity, a maximum input power, and a maximum output power.

5. The power storage system according to claim 1, wherein the usage method data indicates a change over time of at least one of a temperature, a C rate, and a state of charge (SOC) of the storage battery.

6. The power storage system according to claim 1, wherein the processor is further configured to execute the one or more instructions to predict a time until the first performance value reaches a lower limit based on the target value and the usage method data.

7. The power storage system of claim 1, further comprising:
- a performance measuring apparatus configured to measure the first performance value of the storage battery; and
- a usage measurement unit configured to repeatedly measure usage method data of the storage battery, the usage method data thereby indicating a change over time of a characteristic of the storage battery.

8. A performance compensation system comprising:
- a power storage system comprising:
  - a battery management system configured to control charging and discharging of a storage battery,
  - a performance measuring apparatus configured to measure a first performance value of the storage battery, and
  - a usage measurement unit configured to repeatedly measure usage method data of the storage battery, the usage method data thereby indicating a change over time of a characteristic of the storage battery;
- an apparatus communicably coupled to the power storage system and comprising:
  - at least one memory configured to store one or more instructions; and
  - at least one processor configured to execute the one or more instructions to:
    - acquire a criteria value that is the first performance value of the storage battery at a criteria time,
    - acquire a target value that is the first performance value of the storage battery at a determination time,
    - acquire the usage method data indicating a usage method of the storage battery from the criteria time to the determination time,
    - compute a predicted range of the first performance value at the determination time based on the criteria value, the usage method data, and a time elapsed from the criteria time to the determination time, and
    - determine whether the storage battery is experiencing abnormal deterioration based on whether the target value is outside the predicted range; and
- an external apparatus communicably coupled to the apparatus and configured to selectively compensate for deterioration of the storage battery based on the determination of the apparatus.

* * * * *